(12) United States Patent
Bennett et al.

(10) Patent No.: US 11,260,646 B2
(45) Date of Patent: Mar. 1, 2022

(54) METHODS FOR PROCESSING A SUBSTRATE

(71) Applicant: CORNING INCORPORATED, Corning, NY (US)

(72) Inventors: Christina Sue Bennett, Hammondsport, NY (US); Raymond Charles Cady, Horseheads, NY (US); Hyun-Soo Choi, Cheonan-si (KR); Claire Renata Coble, Horseheads, NY (US); Byungchul Kim, Asan (KR); Timothy Michael Miller, Elmira, NY (US); Joseph William Soper, Arkport, NY (US); Gary Carl Weber, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/349,845

(22) PCT Filed: Nov. 13, 2017

(86) PCT No.: PCT/US2017/061292
§ 371 (c)(1),
(2) Date: May 14, 2019

(87) PCT Pub. No.: WO2018/093719
PCT Pub. Date: May 24, 2018

(65) Prior Publication Data
US 2019/0275782 A1    Sep. 12, 2019

Related U.S. Application Data

(60) Provisional application No. 62/422,312, filed on Nov. 15, 2016.

(51) Int. Cl.
*B32B 43/00* (2006.01)
*B32B 38/18* (2006.01)
*B32B 38/00* (2006.01)

(52) U.S. Cl.
CPC ........ *B32B 43/006* (2013.01); *B32B 38/1858* (2013.01); *B32B 38/105* (2013.01);
(Continued)

(58) Field of Classification Search
CPC ......... Y10T 156/1132; Y10T 156/1168; Y10T 156/1944; Y10T 156/1978;
(Continued)

(56) References Cited

U.S. PATENT DOCUMENTS 7,384,811 B2 *   6/2008   Miyamoto ........ H01L 21/67132
                                                 438/113
9,162,435 B2 *  10/2015   Honda .................... B32B 38/10
(Continued)

FOREIGN PATENT DOCUMENTS

CN         1606134 A        4/2005
CN       104070779 A    *  10/2014
(Continued)

OTHER PUBLICATIONS

Google translation of CN104070779A. (Year: 2020).*
(Continued)

*Primary Examiner* — Mark A Osele

(57) ABSTRACT

A method of processing a substrate, with a first major surface of the substrate removably bonded to a first major surface of a first carrier and a second major surface of the substrate removably bonded to a first major surface of a second carrier, includes initiating debonding at a first location of an outer peripheral bonded interface between the substrate and the first carrier to separate a portion of the first carrier from the substrate. The method further includes
(Continued)

propagating a first debond front from the first debonded location along a first direction extending away from the first debonded location by sequentially applying a plurality of lifting forces to the first carrier at a corresponding plurality of sequential lifting locations of the first carrier.

17 Claims, 10 Drawing Sheets

(52) U.S. Cl.
CPC . *B32B 2457/20* (2013.01); *H01L 2221/68304* (2013.01); *H01L 2221/68386* (2013.01); *Y10S 156/93* (2013.01); *Y10S 156/941* (2013.01); *Y10T 156/1132* (2015.01); *Y10T 156/1168* (2015.01); *Y10T 156/1944* (2015.01); *Y10T 156/1978* (2015.01); *Y10T 156/1989* (2015.01)

(58) Field of Classification Search
CPC ............ Y10T 156/1989; Y10S 156/93; Y10S 156/941; H01L 2221/68386; H01L 2221/6839; B32B 43/006
See application file for complete search history.

(56) References Cited

U.S. PATENT DOCUMENTS

| | | | | |
|---|---|---|---|---|
| 9,333,736 | B2* | 5/2016 | Kumakura | B32B 43/006 |
| 9,623,648 | B2* | 4/2017 | Kim | B32B 43/006 |
| 9,688,062 | B2 | 6/2017 | Asakawa | |
| 9,731,492 | B2* | 8/2017 | Lee | B32B 43/006 |
| 9,805,953 | B2* | 10/2017 | Ohno | H01L 21/6838 |
| 2004/0166653 | A1* | 8/2004 | Kerdiles | G01N 19/04 |
| | | | | 438/458 |
| 2005/0150597 | A1* | 7/2005 | Henley | B28D 5/00 |
| | | | | 156/755 |
| 2008/0302481 | A1 | 12/2008 | Berger et al. | |
| 2011/0198040 | A1* | 8/2011 | Ebata | B65H 41/00 |
| | | | | 156/750 |
| 2014/0150980 | A1* | 6/2014 | Itou | B32B 43/006 |
| | | | | 156/714 |
| 2014/0251546 | A1 | 9/2014 | Deguchi et al. | |
| 2014/0332166 | A1 | 11/2014 | Honda et al. | |
| 2015/0059411 | A1 | 3/2015 | Lim et al. | |
| 2015/0059987 | A1 | 3/2015 | Kumakura et al. | |
| 2015/0151531 | A1 | 6/2015 | Ohno et al. | |
| 2015/0217556 | A1 | 8/2015 | Lee et al. | |
| 2016/0214367 | A1* | 7/2016 | Choi | B32B 43/006 |
| 2018/0145255 | A1* | 5/2018 | Yu | H01L 27/1266 |

FOREIGN PATENT DOCUMENTS

| | | |
|---|---|---|
| JP | 47033655 U | 12/1972 |
| JP | 2010058869 A | 3/2010 |
| JP | 5307970 B2 | 10/2013 |
| JP | 2013249935 A | 12/2013 |
| JP | 2014141344 A | 8/2014 |
| JP | 2014-175420 A | 9/2014 |
| JP | 2015104800 A | 6/2015 |
| JP | 2015209324 A | 11/2015 |
| JP | 2015230898 A | 12/2015 |
| JP | 2016011210 A | 1/2016 |
| JP | 2016037328 A | 3/2016 |
| JP | 2016-155683 A | 9/2016 |
| KR | 2015021318 A | 3/2015 |
| KR | 2016079669 A | 7/2016 |
| TW | 201501232 A | 1/2015 |
| WO | 2015012261 A1 | 1/2015 |
| WO | 2015012268 A1 | 1/2015 |
| WO | 2015041165 A1 | 3/2015 |

OTHER PUBLICATIONS

International Search Report and Written Opinion of the International Searching Authority; PCT/US2017/061292; dated Feb. 2, 2018; 14 Pages; European Patent Office.

Chinese Patent Application No. 201780076016.2, Office Action dated Jan. 28, 2021; 9 pages (English Translation Only); Chinese Patent Office.

Japanese Patent Application No. 2019-525843, Office Action dated Nov. 19, 2021, 14 pages (7 pages of English Translation and 7 pages of Original Document), Japanese Patent Office.

* cited by examiner

METHODS FOR PROCESSING A SUBSTRATE

CROSS-REFERENCE TO RELATED APPLICATIONS

This application claims the benefit of priority under 35 U.S.C. § 371 of International Application No. PCT/US2017/061292, filed on Nov. 13, 2017, which claims the benefit of priority under 35 U.S.C. § 119 of U.S. Provisional Application Ser. No. 62/422,312 filed on Nov. 15, 2016, the content both of which are relied upon and incorporated herein by reference in their entirety.

FIELD

The present disclosure relates generally to methods of processing a substrate and, more particularly, to methods of processing a substrate by initiating debonding at a location of an outer peripheral bonded interface between the substrate and a carrier.

BACKGROUND

Glass sheets are commonly used, for example, in display applications, for example liquid crystal displays (LCDs), electrophoretic displays (EPD), organic light emitting diode displays (OLEDs), plasma display panels (PDPs), touch sensors, photovoltaics, or the like. Glass sheets are commonly fabricated by flowing molten glass to a forming body whereby a glass ribbon may be formed by a variety of ribbon forming processes, for example, slot draw, float, down-draw, fusion down-draw, rolling, or up-draw. The glass ribbon may then be subsequently divided to provide thin, flexible sheets of glass suitable for further processing into a desired display application including, but not limited to, a substrate for mobile devices, wearables (e.g., watches), televisions, computers, tablets, and other display monitors. There is interest in providing and processing thin, flexible glass sheets in the fabrication of substrates including flexible electronics or other electronic devices. The fabrication of the substrates may include transport and handling of the thin, flexible glass sheets. Thus, there is a demand for methods of processing the substrate.

In one manner of handling the thin, flexible glass during processing of the substrate, the flexible glass is bonded to a carrier. Once bonded to the carrier, the characteristics and size of the carrier allow the bonded structure to be handled and transported in production without undesired bending of the glass sheet and without causing damage to the glass sheet. For example, a thin, flexible glass sheets may be bonded to a relatively rigid carrier, and then functional components (e.g., a color filter, touch sensor, or thin-film transistor (TFT) components) may be attached to the thin, flexible glass sheet to produce a glass substrate that may be used in the production of electronic devices for display applications. Once transport, handling and other processing steps are complete, there is a desire to remove the substrate from the carrier. However, given the delicate nature of the substrate, damage may unfortunately occur to the carrier and/or to the substrate bonded to the carrier when attempting to remove the substrate from the carrier. For example, based at least in part on the strong bond interface between the carrier and the substrate, significant force may need to be applied to break the bond. In addition, the carrier and the substrate may be damaged when attempting to peel and completely separate the carrier from the substrate. Accordingly, there is a demand for practical solutions for separating the substrate from carrier without damaging the carrier and/or the substrate bonded to the carrier.

SUMMARY

There are set forth exemplary embodiments of methods of processing a substrate, including a substrate removably bonded to one or more carriers. Methods of processing the substrate may, for example, include initiation of debonding between the substrate and the one or more carriers as well as complete separation of the substrate and the one or more carriers.

Single substrates throughout the disclosure include a wide range of substrates including a single glass substrate (e.g., a single flexible glass substrate, or single rigid glass substrate), a single glass-ceramic substrate, a single ceramic substrate, or a single silicon substrate. As used herein the term "glass" is meant to include any material made at least partially of glass, including glass and glass-ceramics. "Glass-ceramics" include materials produced through controlled crystallization of glass. In embodiments, glass-ceramics have about 30% to about 90% crystallinity. Non-limiting examples of glass ceramic systems that may be used include $Li_2O \times Al_2O_3 \times nSiO_2$ (i.e. LAS system), $MgO \times Al_2O_3 \times nSiO_2$ (i.e. MAS system), and $ZnO \times Al_2O_3 \times nSiO_2$ (i.e. ZAS system). In some embodiments, the single substrate includes a single blank substrate of material, for example a single blank glass substrate (e.g., a glass sheet including pristine surfaces separated from a glass ribbon produced by a down-draw fusion process or other technique), a single blank glass-ceramic substrate, a single blank silicon substrate (e.g., a single blank silicon wafer). If provided as a single blank glass substrate, the single blank glass substrate may be transparent, translucent, or opaque and may optionally include the same glass composition throughout the entire thickness of the single blank glass substrate from a first major surface to a second major surface of the single blank glass substrate. In some embodiments, the single blank glass substrate may include a single blank glass substrate that has been chemically strengthened.

Any of the single substrates of the disclosure may optionally include a wide range of functionality. For example, single glass substrates may include features that allow the single substrate to modify light or be incorporated into a display device, touch sensor component, or other device. In some embodiments, the single glass substrate may include color filters, polarizers, thin-film transistors (TFT) or other components. In some embodiments, if the single substrate is provided as a single silicon substrate, the single silicon substrate may include features that allow the single silicon substrate to be incorporated into an integrated circuit, a photovoltaic device, or other electrical component.

In some embodiments, the substrate may include a stack of single substrates, including, for example, any one or more single substrates. The stack of single substrates may be built by two or more single substrates stacked relative to one another with facing major surfaces of adjacent single substrates being bonded relative to one another. In some embodiments, the stack of single substrates may include a stack of single glass substrates. For example, a first single glass substrate may include a color filter and a second single glass substrate may include one or more thin-film transistors. The first and second single glass substrates may be bonded together as a stack of single substrates that may be formed as a display panel for display applications. Accordingly, substrates of the present disclosure may include any one or more single substrates or stack of single substrates.

Various methods beneficial to remove the substrate from one or more carriers bonded to the substrate are also provided. In some embodiments, a substrate (e.g., one or more single substrates, stack of single substrates) is removably bonded to one or more carriers. In some embodiments, a first major surface of the substrate may be bonded to a single carrier. Additionally, in some embodiments both major surfaces of a substrate may be bonded to respective carriers with the substrate positioned between the respective carriers.

In some embodiments, after bonding the substrate to the one or more carriers, there is a desire to remove the one or more carriers without damaging the substrate. The present disclosure provides exemplary embodiments of the substrate and the one or more carriers that facilitate initiation of debonding and complete separation of the carriers from the substrate. For example, there are provided features that may facilitate initial debonding between the carrier and the substrate bonded to the carrier, as well as complete separation (e.g., by peeling) of the carrier from the substrate bonded to the carrier. The initial location of the bonded interface, where debonding is initiated, provides a desired point of weakness in the bonded interface. Thus, in some embodiments, subsequent peeling techniques may involve significantly less force as debonding has already been initiated. Because there is a reduction in the maximum applied force to completely separate the carrier from the substrate (e.g., by way of peeling), the associated stress applied to the substrate is likewise reduced, thereby further reducing possible damage to the substrate.

Some exemplary embodiments of the disclosure are described below with the understanding that any of the embodiments, including any one or more features of the various embodiments, may be used alone or in combination with one another.

Embodiment 1

A method of processing a substrate with a first major surface of the substrate removably bonded to a first major surface of a first carrier and a second major surface of the substrate removably bonded to a first major surface of a second carrier includes initiating debonding at a first location of an outer peripheral bonded interface between the substrate and the first carrier to separate a portion of the first carrier from the substrate. The method further includes propagating a first debond front from the first debonded location along a first direction extending away from the first debonded location by sequentially applying a plurality of lifting forces to the first carrier at a corresponding plurality of sequential lifting locations of the first carrier. Each lifting force of the plurality of lifting forces is sequentially applied at a corresponding lifting location of the plurality of sequential lifting locations after the first debond front has propagated past the corresponding lifting location of the first carrier.

Embodiment 2

The method of embodiment 1, includes sequentially applying the plurality of lifting forces to the first carrier at the corresponding plurality of sequential lifting locations of the first carrier to propagate the first debond front until the first carrier is completely separated from the substrate.

Embodiment 3

The method of any one of embodiments 1 and 2, the plurality of lifting forces are sequentially applied by a corresponding plurality of suction cups arranged along the first direction.

Embodiment 4

The method of embodiment 3, the plurality of suction cups engage the first carrier prior to propagating the first debond front, the plurality of lifting forces are sequentially applied by a respective suction cup of the plurality of suction cups after the first debond front propagates past the respective suction cup and before the first debond front propagates past an immediately adjacent suction cup of the plurality of suctions cups arranged downstream from the respective suction cup along the first direction.

Embodiment 5

The method of any one of embodiments 1-4 includes continuously propagating the first debond front without ceasing propagation of the first debond front until the first carrier is completely separated from the substrate.

Embodiment 6

The method of any one of embodiments 1-5, includes decreasing bond energy between the substrate and the first carrier based on thermoelectric effect.

Embodiment 7

The method of embodiment 6, decreasing bond energy between the substrate and the first carrier includes decreasing a temperature of the first carrier.

Embodiment 8

The method of any one of embodiments 1-7, includes inhibiting bending of the second carrier while applying the plurality of lifting forces to the first carrier.

Embodiment 9

The method of embodiment 8, inhibiting bending of the second carrier includes removably attaching a second major surface of the second carrier to a plate to inhibit bending of the second carrier while applying the plurality of lifting forces to the first carrier.

Embodiment 10

The method of any one of embodiments 1-9, the first location of the outer peripheral bonded interface between the substrate and the first carrier includes a corner portion of the substrate defined between an intersection of a first edge and a second edge of the substrate.

Embodiment 11

The method of embodiment 10, the first direction extends from the corner portion of the substrate diagonally across the substrate.

Embodiment 12

The method of any one of embodiments 1-9, the first location of the outer peripheral bonded interface between the substrate and the first carrier includes an outer peripheral edge of the substrate, the first direction extends perpendicular to the outer peripheral edge of the substrate and across the substrate.

Embodiment 13

The method of embodiment 2 includes, after completely separating the first carrier from the substrate, then initiating debonding at a second location of an outer peripheral bonded interface between the substrate and the second carrier to separate a portion of the second carrier from the substrate. The method further includes propagating a second debond front from the debonded location along a second direction extending away from the second debonded location by sequentially applying a plurality of lifting forces to the second carrier at a corresponding plurality of sequential lifting locations of the second carrier. Each lifting force of the plurality of lifting forces is sequentially applied to a corresponding lifting location of the plurality of sequential lifting locations after the second debond front has propagated past the corresponding lifting location of the second carrier.

Embodiment 14

The method of embodiment 13 includes sequentially applying the plurality of lifting forces to the second carrier at the corresponding plurality of sequential lifting locations of the second carrier to propagate the debond front until the second carrier is completely separated from the substrate.

Embodiment 15

The method of any one of embodiments 13 and 14 includes continuously propagating the second debond front without ceasing propagation of the second debond front until the second carrier is completely separated from the substrate.

Embodiment 16

The method of any one of embodiments 13-15 includes decreasing bond energy between the substrate and the second carrier based on thermoelectric effect.

Embodiment 17

The method of embodiment 16, decreasing bond energy between the substrate and the second carrier includes decreasing a temperature of the second carrier.

Embodiment 18

The method of any one of embodiments 13-17, includes inhibiting bending of the substrate while applying the plurality of lifting forces to the second carrier.

Embodiment 19

The method of embodiment 18, inhibiting bending of the substrate includes removably attaching the first major surface of the substrate to a plate to inhibit bending of the substrate while applying the plurality of lifting forces to the second carrier.

Embodiment 20

The method of any one of embodiment 13-19, the second location of the outer peripheral bonded interface between the substrate and the second carrier includes a corner portion of the substrate defined between an intersection of a first edge and a second edge of the substrate.

Embodiment 21

The method of embodiment 20, the second direction extends from the corner of the substrate diagonally across the substrate.

Embodiment 22

The method of any one of embodiment 13-19, the second location of the outer peripheral bonded interface between the substrate and the second carrier includes an outer peripheral edge of the substrate, the second direction extends perpendicular to the outer peripheral edge of the substrate and across the substrate.

Embodiment 23

The method of any one of embodiments 1-22, the substrate includes at least one of glass and silicon.

BRIEF DESCRIPTION OF THE DRAWINGS

The above and other features and advantages of embodiments of the present disclosure are better understood when the following detailed description is read with reference to the accompanying drawings, in which.

DETAILED DESCRIPTION

Figure 1:
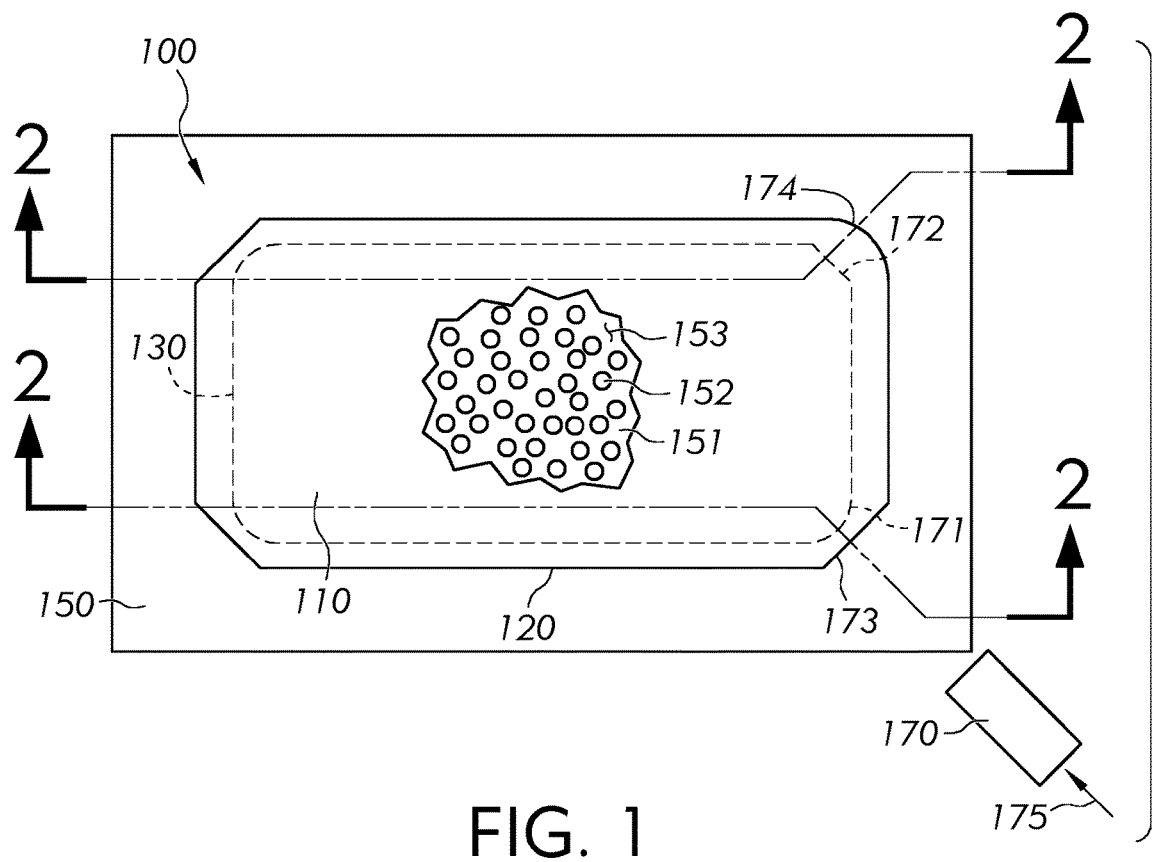
FIG. 1 is a schematic plan view of a second carrier being vacuum attached to a vacuum plate with a portion of a substrate, a first carrier, and the second carrier being broken away to illustrate vacuum ports of the vacuum plate in accordance with embodiments of the disclosure.

Embodiments will now be described more fully hereinafter with reference to the accompanying drawings in which exemplary embodiments are shown. Whenever possible, the same reference numerals are used throughout the drawings to refer to the same or like parts. However, claims may encompass many different aspects of various embodiments and should not be construed as limited to the embodiments set forth herein.

To enable the handling and transport of a substrate during processing, the substrate may be bonded to a carrier. Relative to the substrate, characteristics and size of the carrier may allow the bonded substrate to be handled and transported during processing without significant bending of the substrate that may damage the substrate and/or damage components that may be mounted to the substrate. Unless otherwise noted, the substrate of any of the embodiments of the disclosure may include a single substrate or a stack of two or more single substrates. The single substrates may have a thickness of from about 50 microns to about 300 microns, and all ranges and sub-ranges between the foregoing, although other thicknesses may be provided in some embodiments. In some embodiments, a single flexible glass substrate or a stack of single flexible glass substrates may be removably bonded to a carrier using a binding agent, for example a polymer binding agent, silicone binding agents, forces naturally generated between one or more roughened abutting surfaces or other binding agents. In some embodiments, the substrate may be bonded to a carrier fabricated from glass, resin or other materials capable of withstanding conditions during processing of the substrate. The carrier may therefore optionally introduce a desired level of rigidity by providing a carrier with additional thickness that is combined with the thickness of the substrate removably bonded to the carrier. In some embodiments, the carrier may include a plate (e.g., rigid plate) with a thickness that is greater than the thickness of the single substrate bonded to the carrier. Furthermore, in some embodiments, the carrier may be selected to include a thickness where the overall thickness of the carrier and the substrate bonded to the carrier is within a range that may be employed with processing machinery and equipment configured to process relatively thick glass substrates having a thickness within the range of the overall thickness of the carrier and the substrate bonded to the carrier.

After bonding the substrate to the carrier, there may be a desire to remove the carrier from the substrate without damaging the substrate. For example, prior to processing the single substrate (e.g., by adding one or more functional components), there may be a desire to remove the single substrate from the carrier. Alternatively, in some embodiments, there may be a desire to remove the single substrate from the carrier after the substrate has been processed into a single substrate with one or more functional components and prior to creating the substrate as a stack of single substrates. Additionally, in some embodiments, there may be a desire to remove the carrier from the substrate including the stack of single substrates. Accordingly, irrespective of the particular configuration of the substrate, there may be a desire to eventually remove one or more carriers from the substrate. Due to the delicate nature of the substrate, in some embodiments, there may be a desire to remove one of the carriers from the substrate without contacting the substrate, and then to remove the other carrier from the substrate. For example, in some embodiments, there may be a desire to initiate debonding at a predetermined location of an outer peripheral bonded interface between the substrate and the carrier. Such debonding initiation may reduce stress, and may reduce or eliminate possible resulting damage to the substrate and/or to the carrier that may otherwise occur without a debonding initiation step. In some embodiments, providing a debonding initiation step may target a relatively small location of the outer peripheral bonded interface to allow initial debonding over a small area with a first force, thereby providing a point of weakness in the bond between the substrate and the carrier that may allow easier complete removal (e.g., by peeling) of the carrier from the substrate with a second force that, in some embodiments, may be reduced compared to the first force. In some embodiments, the initiation area may be extended across a portion of or an entire dimension of the substrate and/or carrier before peeling.

Figure 2:
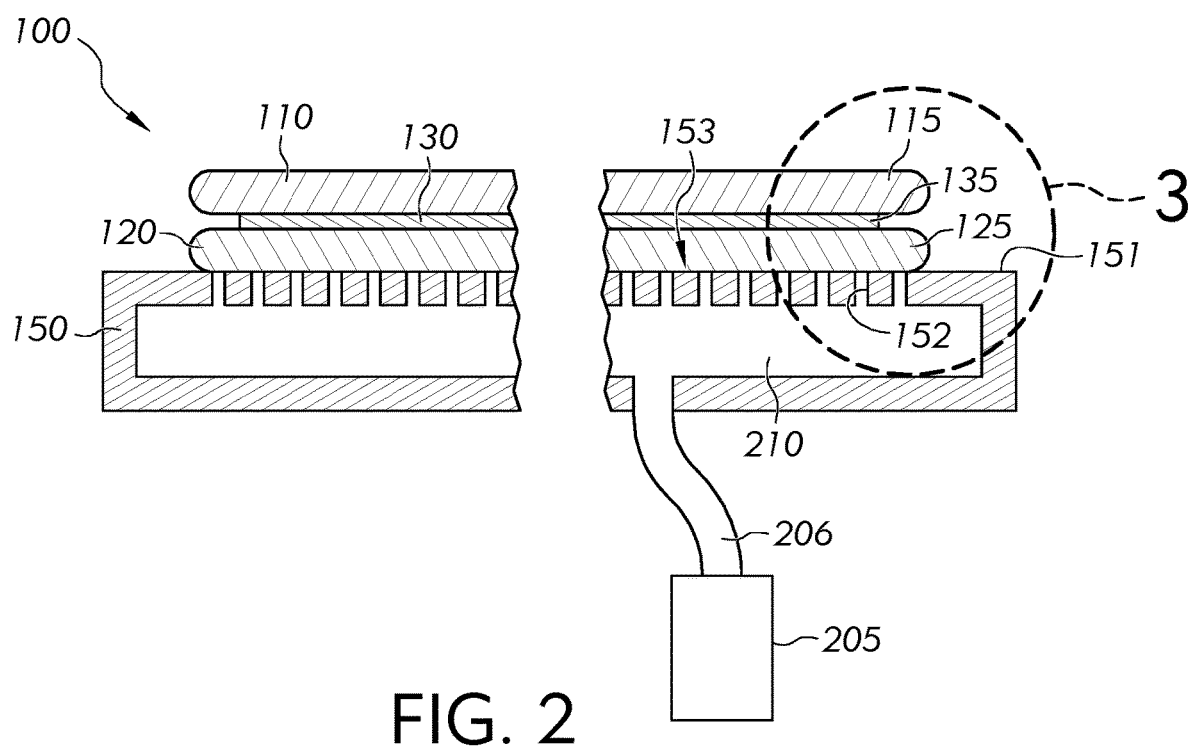
FIG. 2 is a schematic cross-sectional view along line 2-2 of FIG. 1 in accordance with embodiments of the disclosure.
Figure 3:
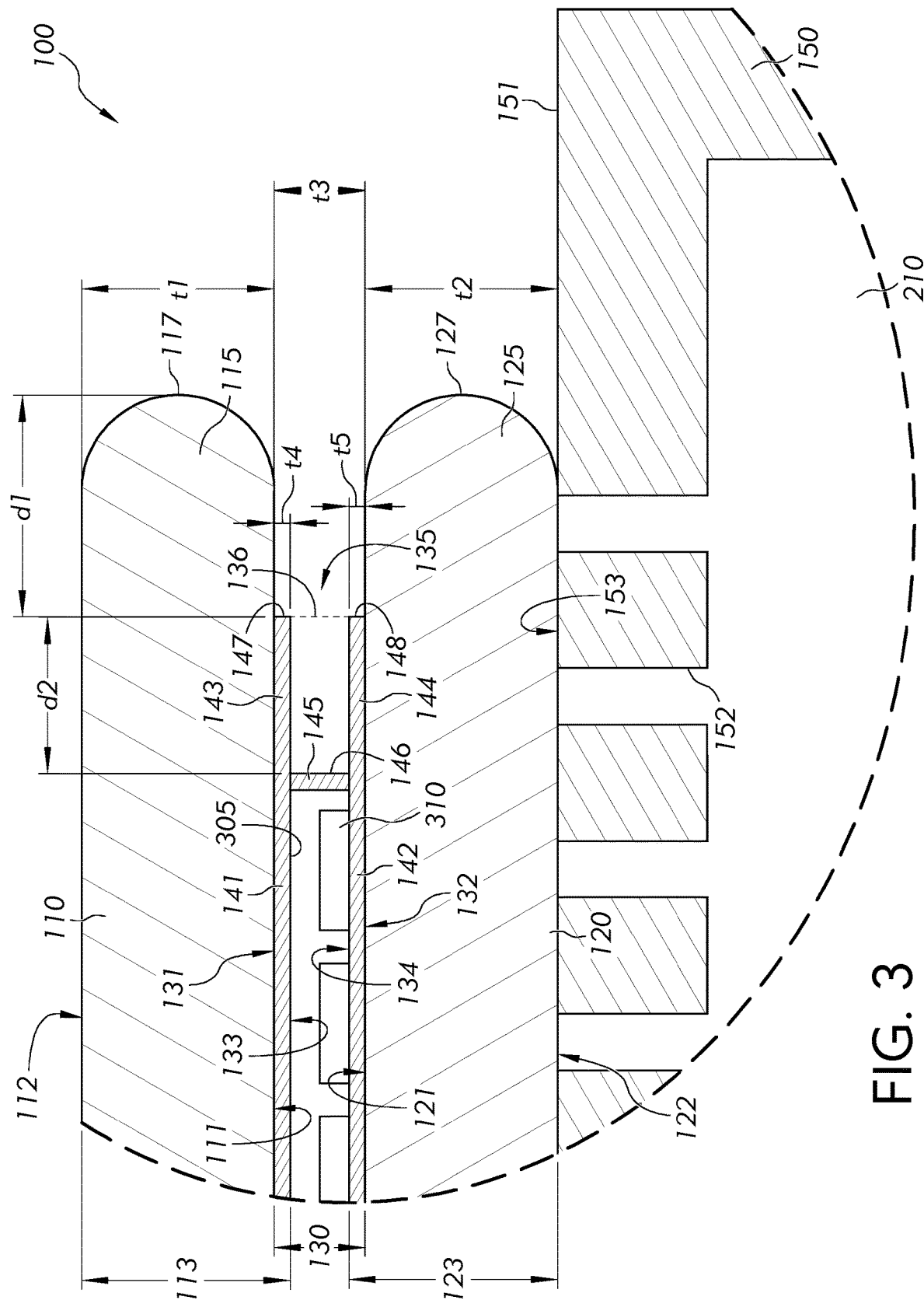
FIG. 3 is an enlarged schematic view taken at view 3 of FIG. 2 illustrating the first carrier, the second carrier, and the substrate including a first sheet, a second sheet, and an interface wall in accordance with embodiments of the disclosure.

As schematically shown in FIG. 1, and in FIG. 2 which provides a cross-sectional view along line 2-2 of FIG. 1, in some embodiments, an apparatus 100 may include a first carrier 110, a second carrier 120, and a substrate 130. Additionally, as shown in FIG. 3, which provides an enlarged view of the apparatus 100 taken at view 3 of FIG. 2, in some embodiments, the first carrier 110 may include a first major surface 111 and an opposing second major surface 112 with a thickness "t1" of the first carrier 110 defined from the first major surface 111 to the second major surface 112. Similarly, the second carrier 120 may include a first major surface 121 and an opposing second major surface 122 with a thickness "t2" of the second carrier 120 defined from the first major surface 121 to the second major surface 122. Likewise, the substrate 130 may include a first major surface 131 and an opposing second major surface 132 with a thickness "t3" of the substrate 130 defined from the first major surface 131 to the second major surface 132. In some embodiments, at least one of the thickness "t1" of the first carrier 110 and the thickness "t2" of the second carrier 120 may be from about 200 microns to about 700 microns; however, in some embodiments, at least one of the thickness "t1" of the first carrier 110 and the thickness "t2" of the second carrier 120, may be greater than or less than the explicit dimensions provided in disclosure without departing from the scope of the disclosure. In some embodiments, the first major surface 111 of the first carrier 110 may face the first major surface 121 of the second carrier 120 (e.g., with the substrate 130 removably bonded between the facing first major surfaces 111, 121). Additionally, in some embodiments, the first major surface 131 of the substrate 130 may be removably bonded to the first major surface 111 of the first carrier 110 and the second major surface 132 of the substrate 130 may be removably bonded to the first major surface 121 of the second carrier 120.

The substrate 130 may include a first sheet 141 and a second sheet 142 although a single sheet or three or more sheets may be provided in further embodiments. Additionally, in some embodiments, the substrate 130 may include at least one of glass and silicon. For example, in some embodiments, at least one of the first sheet 141 and the second sheet 142 may include a sheet of at least one of glass and silicon. As shown, in some embodiments, the first major surface 131 of the substrate 130 may be defined by an outer surface of the first sheet 141, and the second major surface 132 of the substrate 130 may be defined by an outer surface of the second sheet 142. Additionally, an inner surface 133 of the first sheet 141 may be bonded to an inner surface 134 of the second sheet 142 at an interface wall 145. As shown, the interface wall 145 may comprise a single wall although the interface wall 145 may comprise a plurality of wall portions or other components in further embodiments. For instance, the interface wall 145 may comprise an inner interface wall portion and an outer interface wall portion circumscribing the inner interface wall portion. In some embodiments, a thickness "t4" of the first sheet 141 defined from the outer surface 131 to the inner surface 133 may be from about 50 microns to about 300 microns. Likewise, in some embodiments, a thickness "t5" of the second sheet 142 defined from the outer surface 132 to the inner surface 134 may be from about 50 microns to about 300 microns.

Turning back to FIG. 2, in some embodiments, an outer portion 135 of the substrate 130 may be disposed between an outer portion 115 of the first carrier 110 and an outer portion 125 of the second carrier 120. For example, as shown in FIG. 3, in some embodiments, an outer portion 143 of the first sheet 141 and an outer portion 144 of the second sheet 142 may be disposed between the outer portion 115 of the first carrier 110 and the outer portion 125 of the second carrier 120.

In some embodiments, the first sheet 141 may be removably bonded to the first carrier 110 to provide a first bonded structure 113. Similarly, in some embodiments, the second sheet 142 may be removably bonded to the second carrier 120 to provide a second bonded structure 123. In some embodiments, the first bonded structure 113 may be processed with machinery and equipment designed to handle a component having one or more features (e.g., a same or similar size) as that of the first bonded structure 113. In some embodiments, processing of the first bonded structure 113 may include, for example, adding one or more functional components (e.g., a color filter 305) to the inner surface 133 of the first sheet 141. In some embodiments, the first sheet 141 may be inflexible based at least on bonding of the relatively flexible first sheet 141 with the relatively rigid first carrier 110. For example, when fully debonded from the first carrier 110, the first sheet 141 may include a thin, flexible glass, the processing, handling, and transport of which may be difficult without at least the additional rigidity provided to the first bonded structure 113 from the first carrier 110. Similarly, in some embodiments, the second bonded structure 123 may be processed with machinery and equipment designed to handle a component having one or more features (e.g., a same or similar size) as that of the second bonded structure 123. In some embodiments, processing of the second bonded structure 123 may include, for example, adding one or more functional components (e.g., thin-film transistor (TFT) components 310) to the inner surface 134 of the second sheet 142 to create the second sheet 142. In some embodiments, the second sheet 142 may be inflexible based at least on bonding of the relatively flexible second sheet 142 with the relatively rigid second carrier 120. For example, when fully debonded from the second carrier 120, the second sheet 142 may include a thin, flexible glass, the processing, handling, and transport of which may be difficult without at least the additional rigidity provided to the second bonded structure 123 from the second carrier 120.

Moreover, in some embodiments, the substrate 130 may be inflexible based at least on bonding of the relatively flexible substrate 130 with the relatively rigid first carrier 110 and second carrier 120. For example, when fully debonded from the first carrier 110 and the second carrier 120, the substrate 130 may include a thin, flexible glass panel for display applications, the processing, handling, and transport of which may be difficult without at least the additional rigidity provided to the substrate 130 from the first carrier 110 and/or the second carrier 120. Accordingly, irrespective of the particular configuration of the substrate 130, in some embodiments, the apparatus 100 may reduce chipping, cracking, scratching, scuffing, abrading, bending, breaking, or other damage to the substrate 130 that may otherwise occur if the substrate 130 was to be processed, handled, and transported without being removably bonded to at least one of the first carrier 110 and the second carrier 120. Accordingly, the apparatus 100 may also improve processing, handling, and transport of the substrate 130 to provide a more efficient method of processing the substrate 130 than, for example, processing the substrate 130 without removably bonding the substrate 130 to at least one of the first carrier 110 and the second carrier 120. Moreover, as discussed more fully below, the apparatus 100 may provide characteristics that facilitate initiation of debonding between the substrate 130 and at least one of the first carrier 110 and the second carrier 120 as well as characteristics that facilitate complete separation of at least one of the first carrier 110 and the second carrier 120 from the substrate 130 by propagating a debond front.

Figure 4:
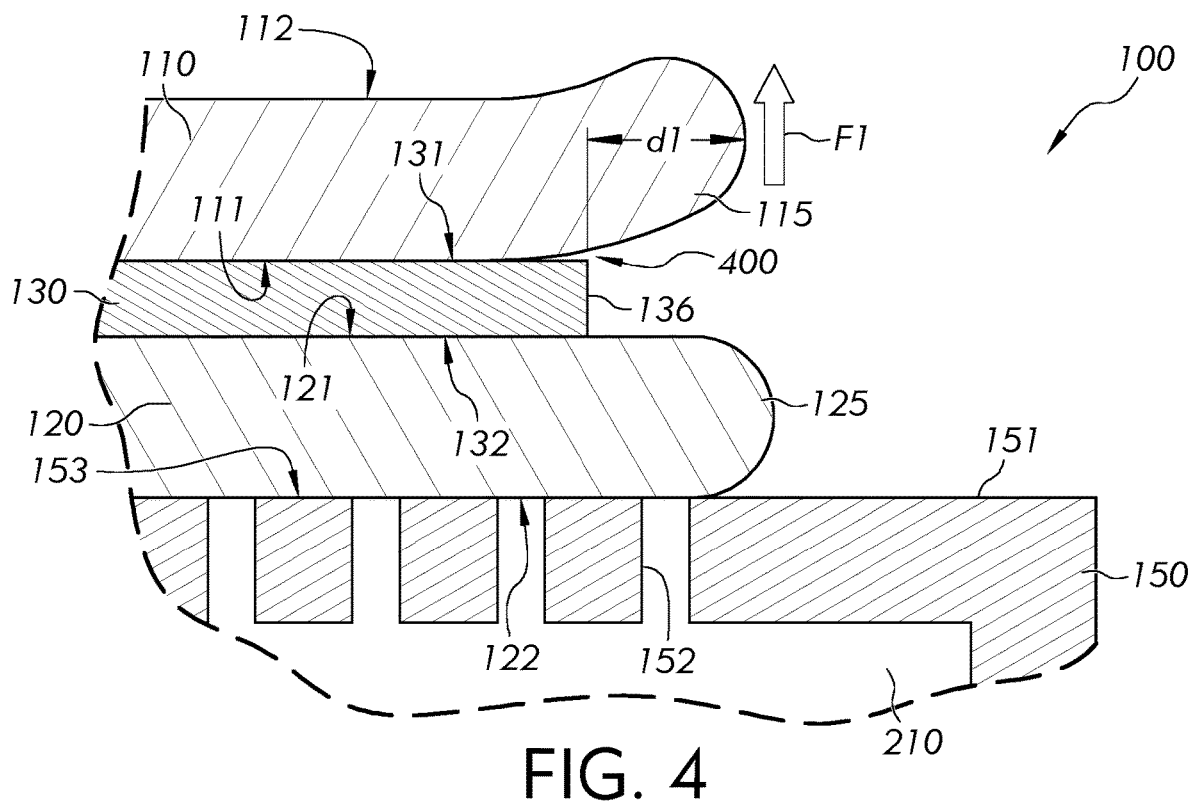
FIG. 4 is an alternate view of FIG. 3 illustrating a method of initiating debonding at a first location of an outer peripheral bonded interface between the substrate and the first carrier in accordance with embodiments of the disclosure.
Figure 5:
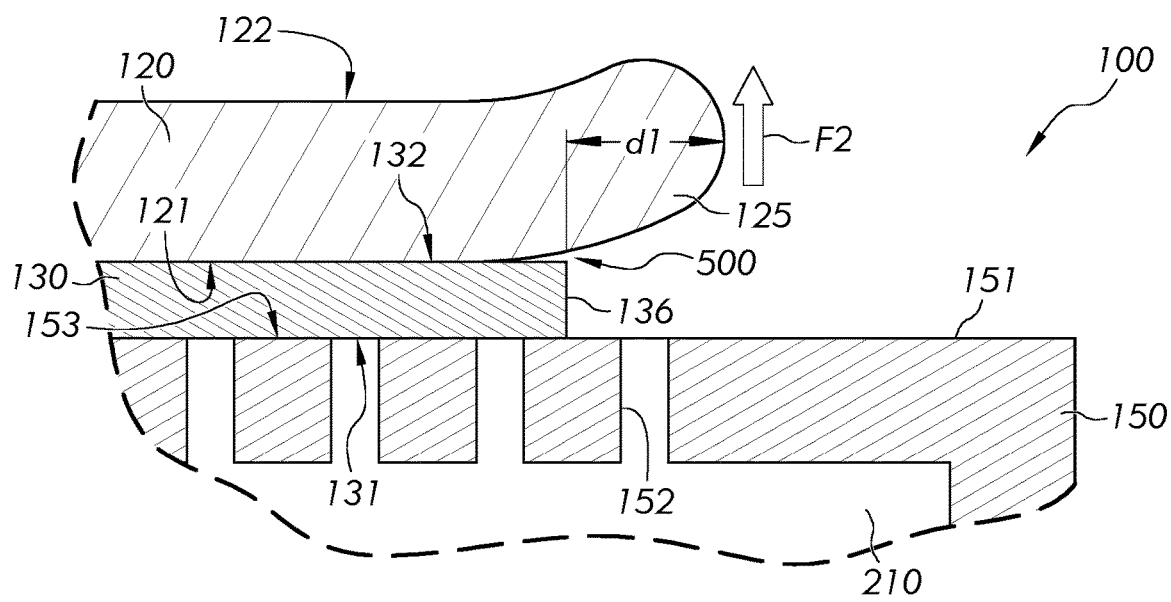
FIG. 5 is an alternate view of FIG. 3 illustrating, after completely separating the first carrier from the substrate, a method of initiating debonding at a second location of an outer peripheral bonded interface between the substrate and the second carrier in accordance with embodiments of the disclosure.

An exemplary method of processing the apparatus 100 is schematically illustrated in FIG. 4 and FIG. 5 which provide alternative views of the apparatus 100 shown in FIG. 3. For simplicity and not limitation, the substrate 130 is schematically illustrated in FIG. 4 and FIG. 5 without depicting certain features including the first sheet 141, the second sheet 142, and the interface wall 145 shown in FIG. 3. Additionally, the apparatus 100 is shown with an optional vacuum device 150 including a plate 151 to which the apparatus 100 may be releasably secured. For example, as shown in FIG. 1 and FIG. 2, the vacuum device 150 may include a vacuum plate 151 that may include one or more vacuum ports 152 that open at a surface 153 (e.g., a substantially planar surface) of the vacuum plate 151. In some embodiments, the one or more vacuum ports 152 may be in selective fluid communication with a vacuum source 205 (shown in FIG. 2) for example a vacuum tank or a vacuum pump. As shown in FIG. 2, a vacuum conduit 206, for example a flexible hose, may provide fluid communication between the one or more vacuum ports 152 and the vacuum source 205. In some embodiments, a vacuum chamber 210 may be in fluid communication with the one or more vacuum ports 152 such that the one or more vacuum ports 152 are in fluid communication with the vacuum conduit 206 and the vacuum source 205. Accordingly, the vacuum device 150 may be employed to releasably secure the apparatus 100 (e.g., the first carrier 110, the second carrier 120, the substrate 130) in place relative to the plate 151.

In some embodiments, the plate 151 may include a rigid structure made out of metal (e.g., stainless steel, aluminum, etc.), plastic, resin or other material that may substantially resist bending under an applied bending moment. Accordingly, when the apparatus 100 is releasably secured to the plate 151, in some embodiments, the plate 151 may likewise impart rigidity to the apparatus 100. Based on the imparted rigidity from the plate 151, in some embodiments, one or more of the first carrier 110, the second carrier 120, and the substrate 130 may also substantially resist bending under an applied bending moment. In some embodiments, releasably securing the apparatus 100 to the plate 151 may also allow one to reasonably control, and therefore predict, which of the first carrier 110 and the second carrier 120 will release from the substrate 130. For example, by releasably securing the second carrier 120 to the plate 151, bending of the apparatus 100 may be primarily limited to the first carrier 110. Alternatively, by releasably securing the first carrier 110 to the plate 151, bending of the apparatus 100 may be primarily limited to the second carrier 120. Similarly, if one of the first carrier 110 or the second carrier 120 has been completely separated from the substrate 130, by releasably securing the substrate 130 to the plate 151, bending of the apparatus 100 may be primarily limited to the remaining first carrier 110 or the remaining second carrier 120.

Although not shown, in some embodiments, one or more standoffs may also be provided to prevent actual engagement between a surface of the apparatus 100 and the surface 153 of the plate 151. If provided, the standoffs may include a peripheral standoff, for example a ring circumscribing the one or more vacuum ports 152. In addition or alternatively, the standoffs may include pillars distributed between one or more vacuum ports 152 throughout the pattern of vacuum ports 152. The pillars may include various materials, for example, a polymeric material. Additionally, the standoffs may extend a distance of about 1.6 mm (e.g., 1/16 of an inch) although other distances may be used in further embodiments. Moreover, in some embodiments, releasably securing the apparatus 100 to the plate 151 may be achieved without a vacuum source 205 and may include adhesive bonding or other techniques.

As schematically illustrated in FIG. 1, in some embodiments, a tool 170 may be employed to initiate debonding of at least one of the first carrier 110 and the second carrier 120 from the substrate 130. In some embodiments, the tool 170 may be inserted in a direction 175 toward a rounded corner 171 of the substrate 130. Alternatively, in some embodiments, the tool 170 may be inserted toward a chamfered corner 172 of the substrate 130. Similarly, the tool 170 may be inserted toward a chamfered corner 173 of at least one of the first carrier 110 and the second carrier 120 or toward a rounded corner 174 of at least one of the first carrier 110 and the second carrier 120. Unless otherwise noted, one or more corners of the first carrier 110, the second carrier 120, and the substrate 130 may include a rounded corner, a chamfered corner, or other shape corner, without departing from the scope of the disclosure.

In some embodiments, the tool 170 may be employed to engage at least one of the first carrier 110 and the second carrier 120 to impart a force on the at least one of the first carrier 110 and the second carrier 120. Accordingly, in some embodiments, based at least on the force imparted on the at least one of the first carrier 110 and the second carrier 120, the tool 170 may be employed to initiate debonding of the at least one of the first carrier 110 and the second carrier 120 from the substrate 130. In some embodiments, the tool 170 may include a wedge (not shown) to engage at least one of the first carrier 110 and the second carrier 120 to impart a force on the at least one of the first carrier 110 and the second carrier 120. For example, in some embodiments, the wedge may be employed to pry the at least one of the first carrier 110 and the second carrier 120 from the substrate 130. Additionally, in some embodiments, the tool 170 may include a rotatable wheel (not shown) having a high coefficient of friction on an outer surface of the wheel. In some embodiments, the rotatable wheel may be employed to engage at least one of the first carrier 110 and the second carrier 120 to impart a force on the at least one of the first carrier 110 and the second carrier 120. For example, in some embodiments, the rotatable wheel may be employed to pry the at least one of the first carrier 110 and the second carrier 120 from the substrate 130.

For example, as shown in FIG. 4, in some embodiments, the method may include initiating debonding at the first location 400 of the outer peripheral bonded interface between the substrate 130 and the first carrier 110 by applying a force "F1" to the outer portion 115 of the first carrier 110 to separate a portion of the first carrier 110 from the substrate 130. In some embodiments, the force "F1" may be applied to the outer portion 115 of the first carrier 110 without contacting any part of the substrate 130. Preventing any contact with the substrate 130 may avoid direct application of force to the substrate 130, thereby reducing probability of damaging the substrate 130 that might otherwise occur with other techniques that may directly contact at least one of the substrate 130 and the first carrier 110 with an object (e.g., a blade, a wedge, a friction wheel) in an attempt to break the outer peripheral bonded interface.

Additionally, the method may include inhibiting bending of the second carrier 120 while applying the force "F1" to the outer portion 115 of the first carrier 110. In some embodiments, inhibiting bending of the second carrier 120 may include removably attaching the second major surface 122 of the second carrier 120 to the plate 151 to inhibit bending of the second carrier 120 while applying the force "F1" to the outer portion 115 of the first carrier 110. In some embodiments, inhibiting bending of the second carrier 120 may encourage debonding to initiate at the first location 400 of the outer peripheral bonded interface between the substrate 130 and the first carrier 110. As discussed more fully below, in some embodiments, the method may include initiating further debonding between the substrate 130 and the first carrier 110 to completely separate the first carrier 110 from the substrate 130. For example, in some embodiments, a debonding device 600 (shown in FIG. 6) may be employed to apply at least one of a lifting force and a peeling force to the first carrier 110 relative to the substrate 130 to propagate a debond front and debond the first major surface 111 of the first carrier 110 from the first major surface 131 of the substrate 130 thereby completely separating the first carrier 110 from the substrate 130.

Unless otherwise noted, the terms "lifting" and "peeling" are not intended to imply a particular orientation of features of the debonding device 600 relative to the direction of gravity. Rather, in one embodiment, "lifting" may be defined as a force or motion occurring in a direction substantially perpendicular to a major surface of one or more of the first carrier 110, the second carrier 120, and the substrate 130 irrespective of the direction of gravity. Likewise, "peeling" may be defined as a force or motion occurring in a direction substantially parallel to a major surface of one or more of the first carrier 110, the second carrier 120, and the substrate 130 irrespective of the direction of gravity. Thus, as illustrated in the drawings, in some embodiments, the debonding device 600 may be positioned at an orientation relative to the direction of gravity such that a major surface of one or more of the first carrier 110, the second carrier 120, and the substrate 130 is substantially horizontal (e.g., perpendicular to the direction of gravity). Accordingly, lifting may therefore occur in a substantially vertical direction (e.g., parallel and opposite to the direction of gravity) and peeling may therefore occur in a substantially horizontal direction (e.g., perpendicular to the direction of gravity). Alternatively, in some embodiments, the debonding device 600 may be positioned at an orientation relative to the direction of gravity such that a major surface of one or more of the first carrier 110, the second carrier 120, and the substrate 130 is oriented at a substantially non-perpendicular angle relative to the direction of gravity. Accordingly, lifting may therefore occur in a direction substantially perpendicular to a major surface of one or more of the first carrier 110, the second carrier 120, and the substrate 130 having an orientation at a substantially non-zero angle relative to the direction of gravity. Likewise, peeling may therefore occur in a direction substantially parallel to a major surface of one or more of the first carrier 110, the second carrier 120, and the substrate 130 having an orientation at a substantially non-perpendicular angle relative to the direction of gravity.

As shown in FIG. 5, in some embodiments, after completely separating the first carrier 110 from the substrate 130, the method may then include initiating debonding at the second location 500 of the outer peripheral bonded interface between the substrate 130 and the second carrier 120 by applying a force "F2" to the second carrier 120 to separate a portion of the second carrier 120 from the substrate 130. For example, the force "F2" may be applied to the outer portion 125 of the second carrier 120. Additionally, the method may include inhibiting bending of the substrate 130 while applying the force "F2" to the outer portion 125 of the second carrier 120. In some embodiments, inhibiting bending of the substrate 130 may include removably attaching the first major surface 131 of the substrate 130 to a plate 151 to inhibit bending of the substrate 130 while applying the force "F2" to the outer portion 125 of the second carrier 120. For example, in some embodiments, after completely separating the first carrier 110 from the substrate 130, the apparatus 100 may be flipped over to provide the substrate 130 facing the plate 151 with the second carrier 120 provided to be debonded from the substrate 130. In some embodiments, inhibiting bending of the substrate 130 may encourage debonding to initiate at the second location 500 of the outer peripheral bonded interface between the substrate 130 and the second carrier 120. As discussed more fully below, in some embodiments, the method may include initiating further debonding between the substrate 130 and the second carrier 120 to completely separate the second carrier 120 from the substrate 130. For example, in some embodiments, the debonding device 600 (shown in FIG. 6) may be employed to apply at least one of a lifting force and a peeling force to the second carrier 120 relative to the substrate 130 to propagate a debond front and debond the first major surface 121 of the second carrier 120 from the second major surface 132 of the substrate 130 thereby completely separating the second carrier 120 from the substrate 130.

Unless otherwise noted, the order of processing the substrate 130 may occur in a variety of optional steps and be modified in accordance with embodiments of the disclosure, without departing from the scope of the disclosure. For example, in some embodiments, initiating debonding between the first carrier 110 and the substrate 130 may be conducted prior to initiating debonding between the second carrier 120 and the substrate 130. Additionally, in some embodiments, initiating further debonding between the first carrier 110 and the substrate 130 may be conducted after initiating debonding between first carrier 110 and the substrate 130 and prior to or after initiating debonding of the second carrier 120 from the substrate 130 as well as prior to or after initiating further debonding of the second carrier 120 from the substrate 130. Likewise, in some embodiments, initiating further debonding between the second carrier 120 and the substrate 130 may be conducted after initiating debonding between second carrier 120 and the substrate 130 and prior to or after initiating debonding of the first carrier 110 from the substrate 130 as well as prior to or after initiating further debonding of the first carrier 110 from the substrate 130. Moreover, completely separating the first carrier 110 from the substrate 130 may be conducted prior to or after one or more of initiating debonding of the second carrier 120 from the substrate 130, initiating further debonding of the second carrier 120 from the substrate 130, and completely separating the second carrier 120 from the substrate 130. Similarly, completely separating the second carrier 120 from the substrate 130 may be conducted prior to or after one or more of initiating debonding of the first carrier 110 from the substrate 130, initiating further debonding of the first carrier 110 from the substrate 130, and completely separating the first carrier 110 from the substrate 130.

Turning back to FIG. 3, in some embodiments, a setback lateral distance "d1" may define a distance between an outer peripheral edge 136 of the outer portion 135 of the substrate 130 and at least one of an outer peripheral edge 117 of the outer portion 115 of the first carrier 110 and an outer peripheral edge 127 of the outer portion 125 of the second carrier 120. In some embodiments, the outer peripheral edge 136 of the outer portion 135 of the substrate 130 may be defined by an outermost feature of at least one of an outer peripheral edge 147 of the outer portion 143 of the first sheet 141 and an outer peripheral edge 148 of the outer portion 144 of the second sheet 142. In some embodiments, the setback lateral distance "d1" may define a dimension from the outer peripheral edge 136 of the outer portion 135 of the substrate 130 to a location at which a force to initiate debonding of at least one of the first carrier 110 from the substrate 130 and the second carrier 120 from the substrate 130 is applied. For example, as shown in FIG. 4, in some embodiments, a force "F1" may be applied to the first carrier 110 to initiate debonding of the first carrier 110 from the substrate 130 at the first location 400 of an outer peripheral bonded interface between the substrate 130 and the first carrier 110. Accordingly, in some embodiments, the setback lateral distance "d1" multiplied by the force "F1" may define a bending moment applied to the outer peripheral bonded interface between the substrate 130 and the first carrier 110 at the first location 400. Similarly, as shown in FIG. 5, in some embodiments, a force "F2" may be applied to the second carrier 120 to initiate debonding of the second carrier 120 from the substrate 130 at the second location 500 of an outer peripheral bonded interface between the substrate 130 and the second carrier 120. Accordingly, in some embodiments, the setback lateral distance "d1" multiplied by the force "F2" may define a bending moment applied to the outer peripheral bonded interface between the substrate 130 and the second carrier 120 at the second location 500.

Turning back to FIG. 3, an offset lateral distance "d2" may be defined between the outer peripheral edge 136 of the outer portion 135 of the substrate 130 and an outer peripheral edge 146 of the interface wall 145. In some embodiments, the offset lateral distance "d2" may provide the interface wall 145 spaced at a predetermined dimension from the outer peripheral edge 136 of the substrate 130. Accordingly, in some embodiments, the interface wall 145 may provide a strong, permanent bond between the first sheet 141 and the second sheet 142 without features of the interface wall 145 contacting or interfering with the first carrier 110 and the second carrier 120. For example, in some embodiments, the interface wall 145 may include an epoxy. Additionally, in some embodiments, the interface wall 145 may include a frit including glass (e.g., sintered frit). In some embodiments, the offset lateral distance "d2" may be constant relative to a boundary extending around a periphery of the substrate 130; or the offset lateral distance "d2" may vary relative to the boundary extending around a periphery of the substrate 130.

Figure 6:
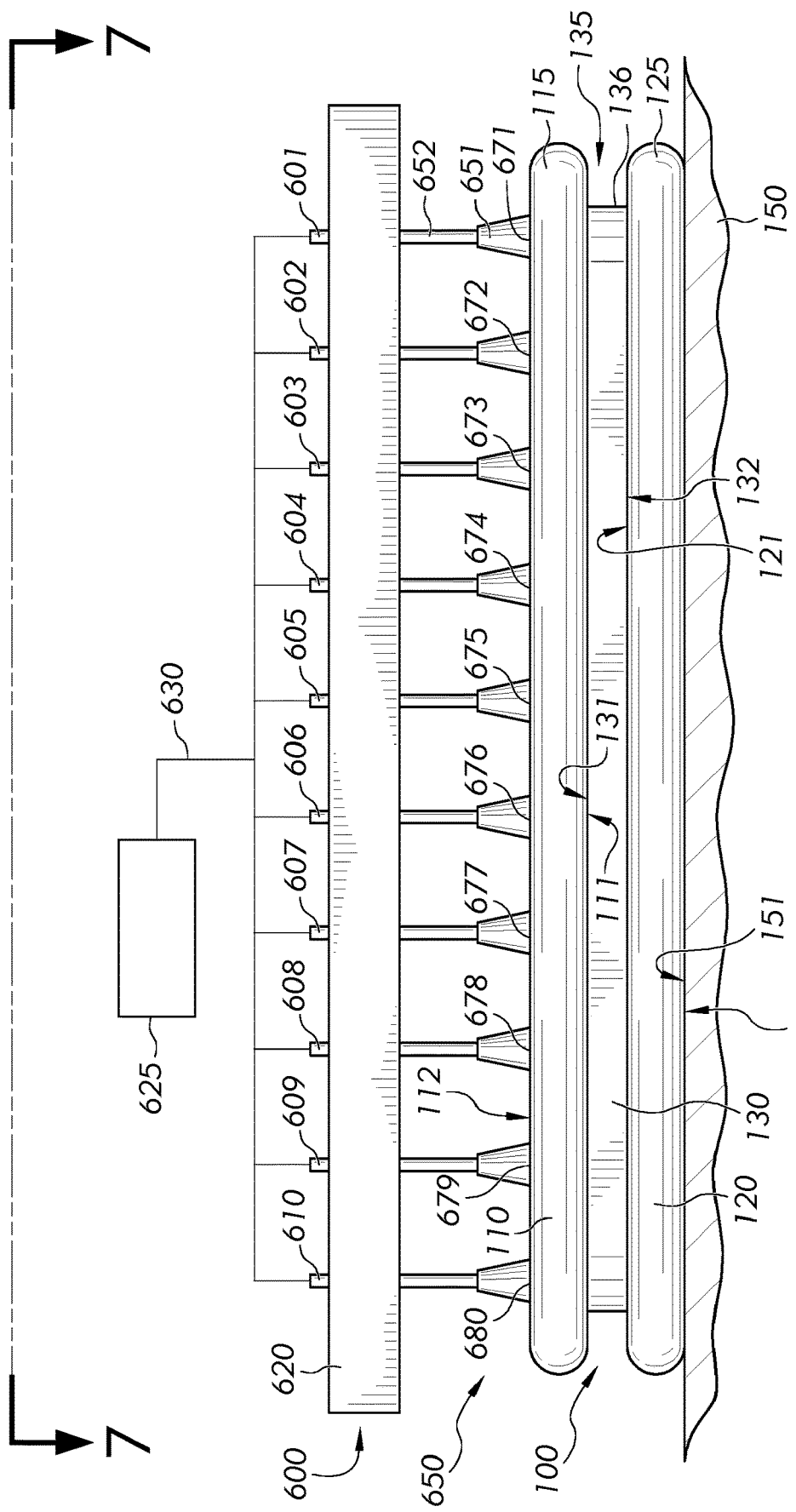
FIG. 6 is a schematic view of a debonding device including a plurality of suction cups for sequentially applying a corresponding plurality of lifting forces to a corresponding plurality of sequential lifting locations in accordance with embodiments of the disclosure.

Exemplary methods of propagating a debond front after initiating debonding. (e.g., as shown in FIGS. 4 and 5) will now be described with reference to FIGS. 6-16. For example, as shown in FIG. 6, in some embodiments a debonding device 600 may include a plurality of suction cups 650. In some embodiments each suction up (e.g., suction cup 651) of the plurality of suction cups 650 may be attached to a corresponding shaft (e.g., shaft 652). In some embodiments, the debonding device 600 may include a frame 620 to which each shaft 652 of the plurality of suction cups 650 may be operably connected. In some embodiments, a controller 625 may be provided to communicate via one or more communication lines 630 with the plurality of suction cups 650. In some embodiments, the controller 625 may include any one or more of a microcontroller, programmable logic controller (PLC), discrete controller, circuit, computer, or other mechanical or electronic control feature including an active or passive user interface by which a robot or human user may select, adjust, start, stop, or otherwise control the one or more operations of the debonding device 600 including, but not limited to, a timing (e.g., sequential timing) operation of any one or more of the plurality of suction cups 650. In some embodiments, the debonding device 600 may be partially or entirely manually operated with or without a controller.

In some embodiments, the controller 625 may independently operate one or more features of one or more of the plurality of suction cups 650. For example, in some embodiments, the controller 625 may independently operate a vacuum function of one or more of the plurality of suction cups 650 to provide a suction force from one or more of the plurality of suction cups 650. Accordingly, in some embodiments, any of the suction cups of the plurality of suction cups 650 may be independently operable to releasably engage and/or disengage, for example, at least one of the first carrier 110 and the second carrier 120. In some embodiments, the controller 625 may independently operate a mechanical function of one or more of the plurality of suction cups 650 to independently move (e.g., at least one of raise and lower) one or more of the plurality of suction cups 650. Accordingly, in some embodiments, any of the suction cups of the plurality of suction cups 650 may be independently operable to move relative to at least one of the first carrier 110 and the second carrier 120. In some embodiments, the plurality of suction cups 650 may be arranged in rows (e.g., first row 601, second row 602, third row 603, fourth row 604, fifth row 605, sixth row 606, seventh row 607, eighth row 608, ninth row 609, tenth row 610). In some embodiments, one or more rows of suction cups of the plurality of suction cups 650 may be independently operable to releasably engage and/or disengage, for example, at least one of the first carrier 110 and the second carrier 120. Likewise, in some embodiments, one or more rows of suction cups of the plurality of suction cups 650 may be independently operable to move relative to at least one of the first carrier 110 and the second carrier 120.

Unless otherwise noted, the particular number of suction cups of the plurality of suction cups 650 as well as the particular number of rows of suction cups are not intended to limit the disclosure. Accordingly, in some embodiments, the debonding device 600 may be modified in accordance with embodiments of the disclosure to include any number of suction cups as well as any number of rows of suction cups without departing from the scope of the disclosure. In some embodiments, the particular number of suction cups of the plurality of suction cups 650 as well as the particular number of rows of suction cups may be based on, for example, one or more of the size of the apparatus 100, the vacuum force desired to be provided from the debonding device 600, and the size or other characteristic features of the suction cups. Moreover, unless otherwise noted, the particular illustrated shape (e.g., circular shape) of the suction cups is not intended to limit the scope of the disclosure. In some embodiments, one or more suction cups of the plurality of suction cups 650 may be compliant to, for example, flex when engaged with at least one of the first carrier 110 and the second carrier 120. For example, in some embodiments, one or more suction cups of the plurality of suction cups 650 may move (e.g., at least one of raise and lower) in a vertical direction (e.g., along an axis of a respective shaft 652) perpendicular to a major surface of at least one of the first carrier 110 and the second carrier 120 and may also flex about an axis perpendicular to the vertical direction. Likewise, in some embodiments, one or more suction cups of the plurality of suction cups 650 may be pivotable relative to at least one of the first carrier 110 and the second carrier 120. For example, in some embodiments, one or more suction cups of the plurality of suction cups 650 may move (e.g., at least one of raise and lower) in the vertical direction perpendicular to a major surface of at least one of the first carrier 110 and the second carrier 120 and also be pivotable about an axis perpendicular to the vertical direction. A resilient or pivotable suction cup may, in some embodiments, reduce the likelihood of causing stress concentrations in one or more of the first carrier 110, the second carrier 120, and the substrate 130 that may otherwise occur, for example, when engaging at least one of the first carrier 110 and the second carrier 120 with a substantially non-compliant (e.g., rigid) suction cup or a suction cup that resists pivoting relative to the at least one of the first carrier 110 and the second carrier 120. Accordingly, in some embodiments, one or more suction cups of the plurality of suction cups 650 may be modified in accordance with embodiments of the disclosure to include a variety of shapes and other characteristic features without departing from the scope of the disclosure.

Figure 7:
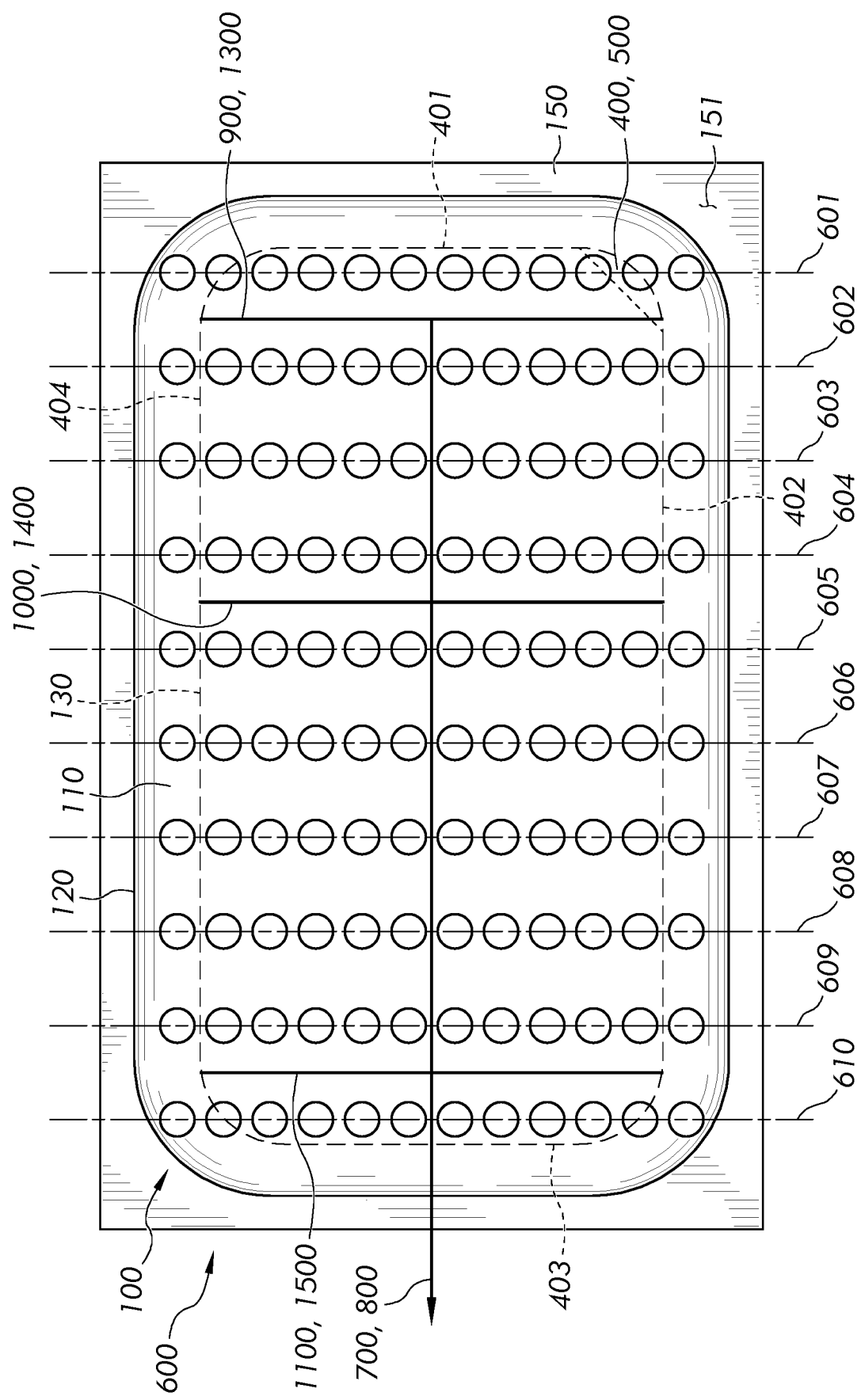
FIG. 7 is a schematic view of the debonding device taken along line 7-7 of FIG. 6 illustrating propagation of a debond front across the substrate along a direction extending perpendicular to an outer peripheral edge of the substrate in accordance with embodiments of the disclosure.
Figure 8:
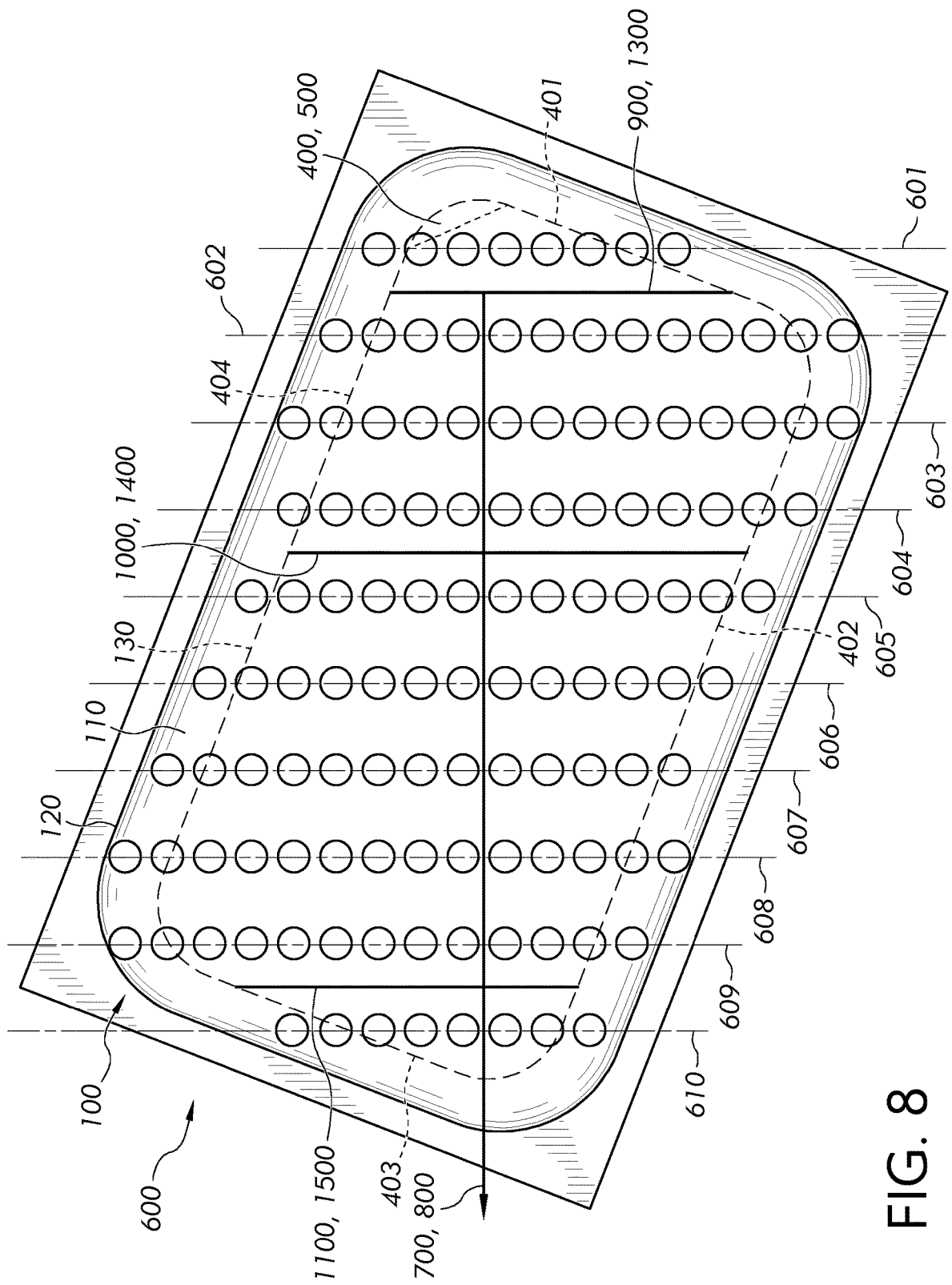
FIG. 8 is an alternate embodiment of the debonding device of FIG. 7 illustrating propagation of a debond front along a direction extending from a corner portion of the substrate diagonally across the substrate in accordance with embodiments of the disclosure.

In some embodiments, a method of processing the substrate 130 may include propagating a first debond front (e.g., first debond front 900, 1000, 1100) from a first debonded location (e.g., first location 400, shown in FIG. 4) along a first direction 700 (shown in FIG. 7 and FIG. 8) extending away from the first debonded location 400. FIG. 7 provides a schematic view of the debonding device 600 taken along line 7-7 of FIG. 6, and FIG. 8 provides an alternate embodiment of the debonding device 600 of FIG. 7. In some embodiments, the first debond front 900, 1000, 1100 may be defined as the location between the first major surface 111 of the first carrier 110 and the first major surface 131 of the substrate 130 at which the bond which removably bonds the first major surface 111 of the first carrier 110 to the first major surface 131 of the substrate 130 transitions from debonded (e.g., behind the first debond front 900, 1000, 1100 relative to the first direction 700 of propagation) to bonded (e.g., in front of the first debond front 900, 1000, 1100 relative to the first direction 700 of propagation). Accordingly, as the first carrier 110 is peeled away from the substrate 130, the first debond front may sequentially propagate along the first direction 700. In some embodiments, the method of processing the substrate 130 may include continuously propagating the first debond front 900, 1000, 1100 without ceasing propagation of the first debond front 900, 1000, 1100 until the first carrier 110 is completely separated from the substrate 130.

In some embodiments, the method of processing the substrate 130 may include propagating the first debond front 900, 1100, 1100 by sequentially applying a plurality of lifting forces to the first carrier 110 at a corresponding plurality of first sequential lifting locations (e.g., first sequential lifting location 671, second sequential lifting location 672, third sequential lifting location 673, fourth sequential lifting location 674, fifth sequential lifting location 675, sixth sequential lifting location 676, seventh sequential lifting location 677, eighth sequential lifting location 678, ninth sequential lifting location 679, tenth sequential lifting location 680, shown in FIG. 6) of the first carrier 110. In some embodiments, each lifting force of the plurality of lifting forces may be sequentially applied at a corresponding lifting location of the plurality of first sequential lifting locations after the first debond front 900, 1000, 1100 has propagated past the corresponding lifting location of the first carrier 110.

Figure 9:
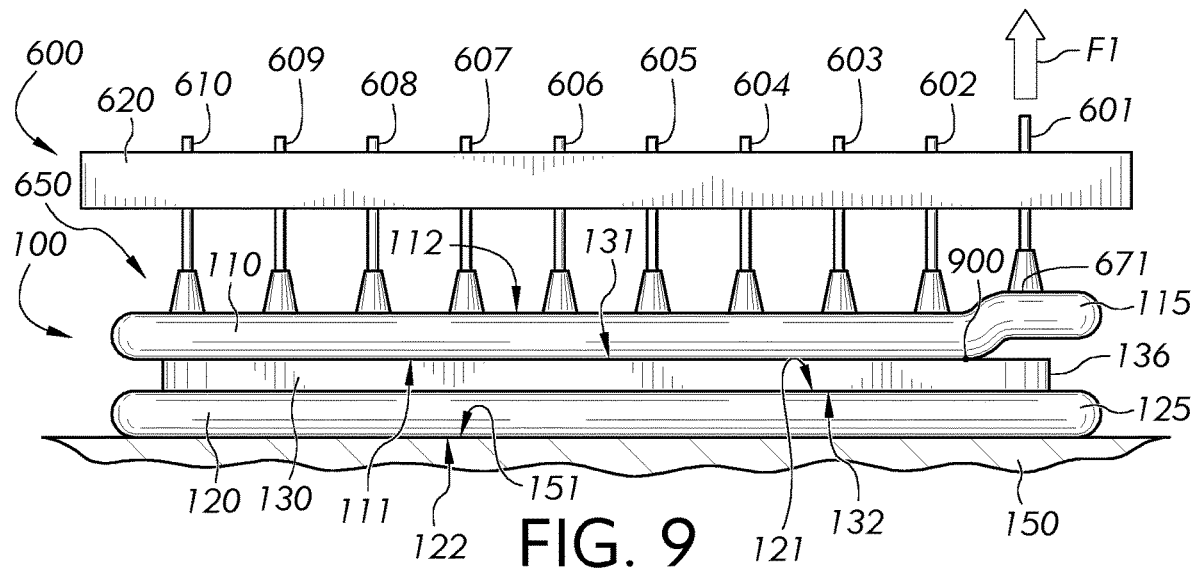
FIGS. 9-11 illustrate exemplary methods of propagating a first debond front by sequentially applying a plurality of lifting forces to the first carrier at a corresponding plurality of sequential lifting locations of the first carrier in accordance with embodiments of the disclosure.
Figure 10:
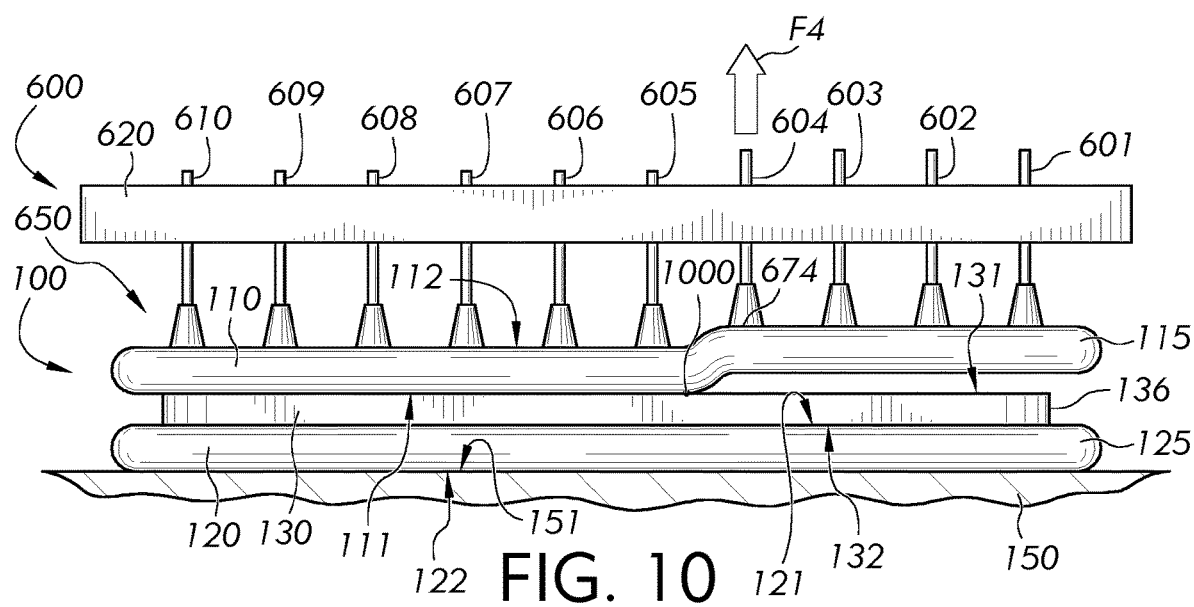
Figure 11:
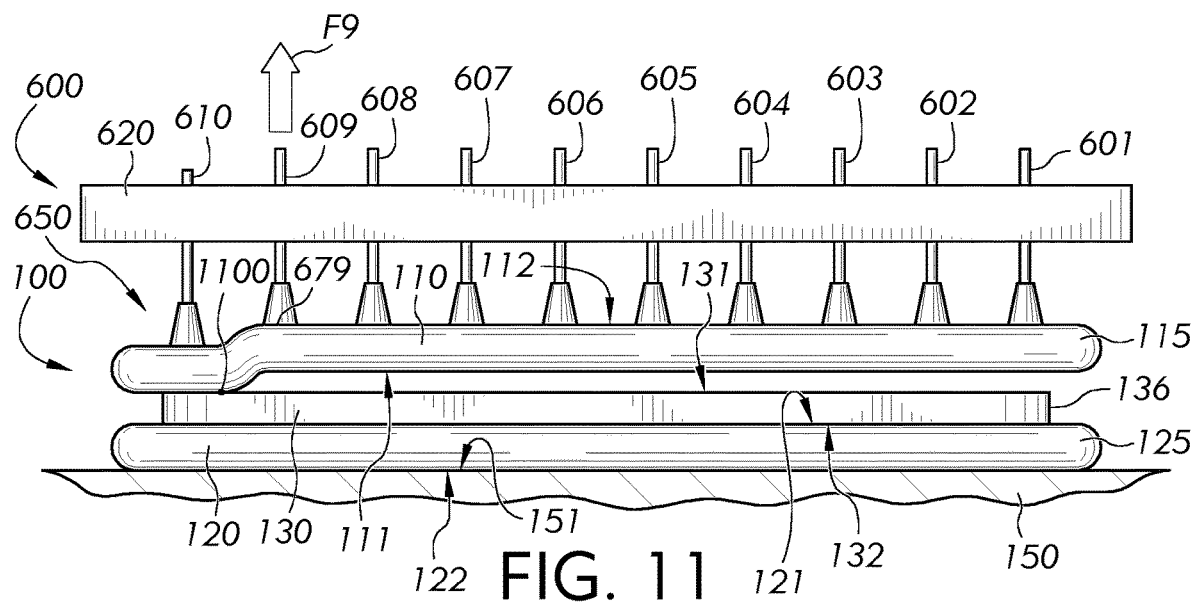
Figure 12:
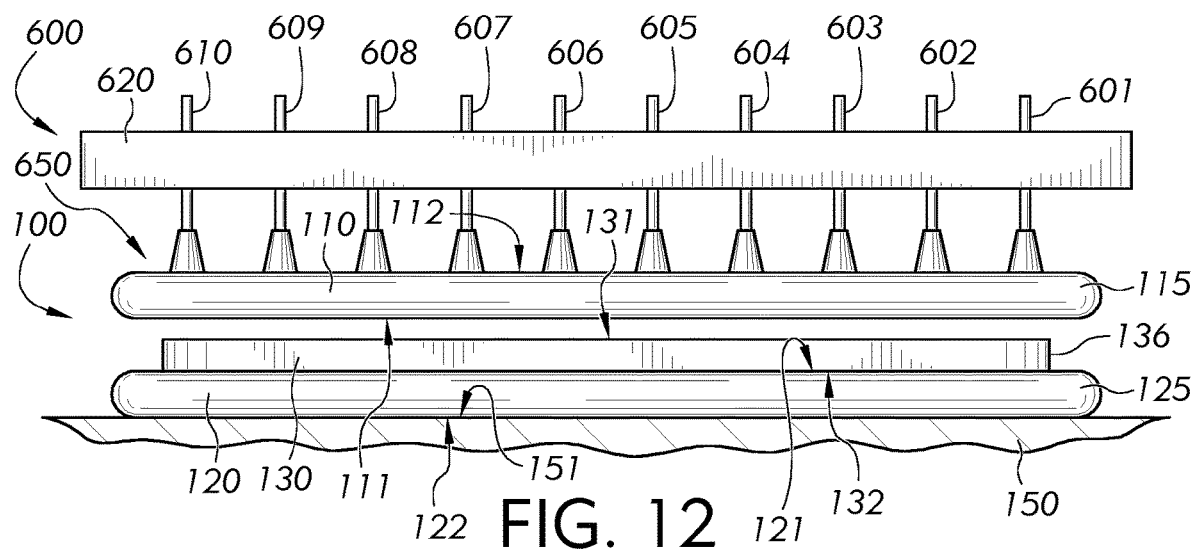
FIG. 12 illustrates exemplary methods of propagating the first debond front of FIGS. 9-11 until the first carrier is completely separated from the substrate in accordance with embodiments of the disclosure.

For example, FIGS. 9-11 illustrate exemplary methods of propagating the first debond front 900, 1000, 1100 by sequentially applying a plurality of lifting forces to the first carrier 110 at the corresponding plurality of first sequential lifting locations 671, 672, 673, 674, 675, 676, 677, 678, 679, 680 of the first carrier 110. To schematically illustrate a dynamic propagation of the first debond front, three representative moments in time of the continuous propagation of the first debond front are illustrated simultaneously in FIG. 7 and FIG. 8 with the understanding that each representative moment in time occurs at a discrete moment in time during the continuous propagation of the first debond front as illustrated individually in FIGS. 9-11. For example, FIG. 9 illustrates the first debond front 900 at a first discrete moment in time; FIG. 10 illustrates the first debond front 1000 at a second discrete moment in time occurring after the first discrete moment in time of FIG. 9; and FIG. 11 illustrates the first debond front 1100 at a third discrete moment in time occurring after the second discrete moment in time of FIG. 10. Additionally, FIG. 12 illustrates exemplary methods of propagating the first debond front 900, 1000, 1100 of FIGS. 9-11 until the first carrier 110 is completely separated from the substrate 130. For example, FIG. 12 illustrates the method of processing the substrate 130 at a fourth discrete moment in time occurring after the third discrete moment in time of FIG. 11.

Turning back to FIGS. 7 and 8, as shown, the first location 400 of the outer peripheral bonded interface between the substrate 130 and the first carrier 110 may include a corner portion of the substrate 130 where debonding between the substrate 130 and the first carrier 110 has been initiated (e.g., as shown in FIG. 4). In some embodiments, the corner portion of the substrate 130 may be defined between an intersection of a first edge 401 and a second edge 402 of the substrate 130. As shown in FIG. 7, in some embodiments, the first location 400 of the outer peripheral bonded interface between the substrate 130 and the first carrier 110 may be extended (e.g., widened) to include an outer peripheral edge (e.g., the entire first edge 401) of the substrate 130. Accordingly, as shown, in some embodiments, the first direction 700 may extend perpendicular to the outer peripheral edge 401 of the substrate 130 and across the substrate 130. Alternatively, as shown in FIG. 8, the first direction 700 may extend from the corner portion (e.g., from the intersection of the first edge 401 and the second edge 402) of the substrate 130 diagonally across the substrate 130.

In some embodiments, after completely separating the first carrier 110 from the substrate 130, the method of processing the substrate 130 may include propagating a second debond front (e.g., second debond front 1300, 1400, 1500) from a second debonded location (e.g., second location 500, shown in FIG. 5) along a second direction 800 (shown in FIG. 7 and FIG. 8) extending away from the second debonded location 500. The second debond front 1300, 1400, 1500 may be defined as the location between the first major surface 121 of the second carrier 120 and the second major surface 132 of the substrate 130 at which the bond which removably bonds the first major surface 121 of the second carrier 120 to the second major surface 132 of the substrate 130 transitions from debonded (e.g., behind the second debond front 1300, 1400, 1500 relative to the second direction 800 of propagation) to bonded (e.g., in front of the second debond front 1300, 1400, 1500 relative to the second direction 800 of propagation). Accordingly, as the second carrier 120 is peeled away from the substrate 130, the second debond front may sequentially propagate along the second direction 800. In some embodiments, the method of processing the substrate 130 may include continuously propagating the second debond front 1300, 1400, 1500 without ceasing propagation of the second debond front 1300, 1400, 1500 until the second carrier 120 is completely separated from the substrate 130.

Figure 13:
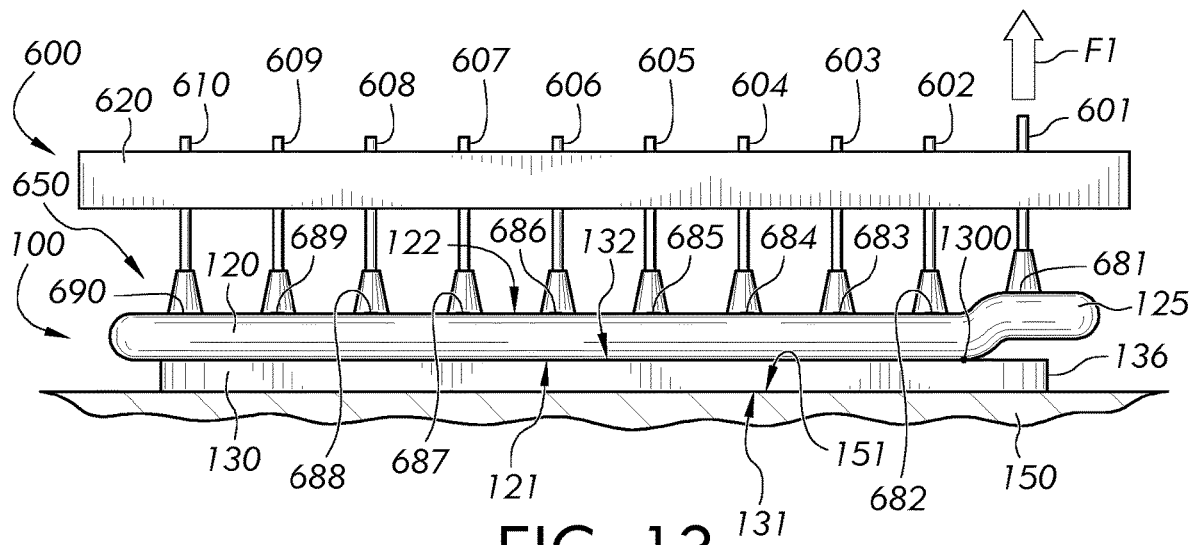
FIGS. 13-15 illustrate exemplary methods of propagating a second debond front by sequentially applying a plurality of lifting forces to the second carrier at a corresponding plurality of sequential lifting locations of the second carrier after completely separating the first carrier from the substrate as illustrated in FIG. 12 in accordance with embodiments of the disclosure.

In some embodiments, the method of processing the substrate 130 may include propagating the second debond front 1300, 1400, 1500 by sequentially applying a plurality of lifting forces to the second carrier 120 at a corresponding plurality of second sequential lifting locations (e.g., first sequential lifting location 681, second sequential lifting location 682, third sequential lifting location 683, fourth sequential lifting location 684, fifth sequential lifting location 685, sixth sequential lifting location 686, seventh sequential lifting location 687, eighth sequential lifting location 688, ninth sequential lifting location 689, tenth sequential lifting location 690, shown in FIG. 13) of the second carrier 120. In some embodiments, each lifting force of the plurality of lifting forces may be sequentially applied at a corresponding lifting location of the second plurality of sequential lifting locations after the second debond front 1300, 1400, 1500 has propagated past the corresponding lifting location of the second carrier 120.

Figure 14:
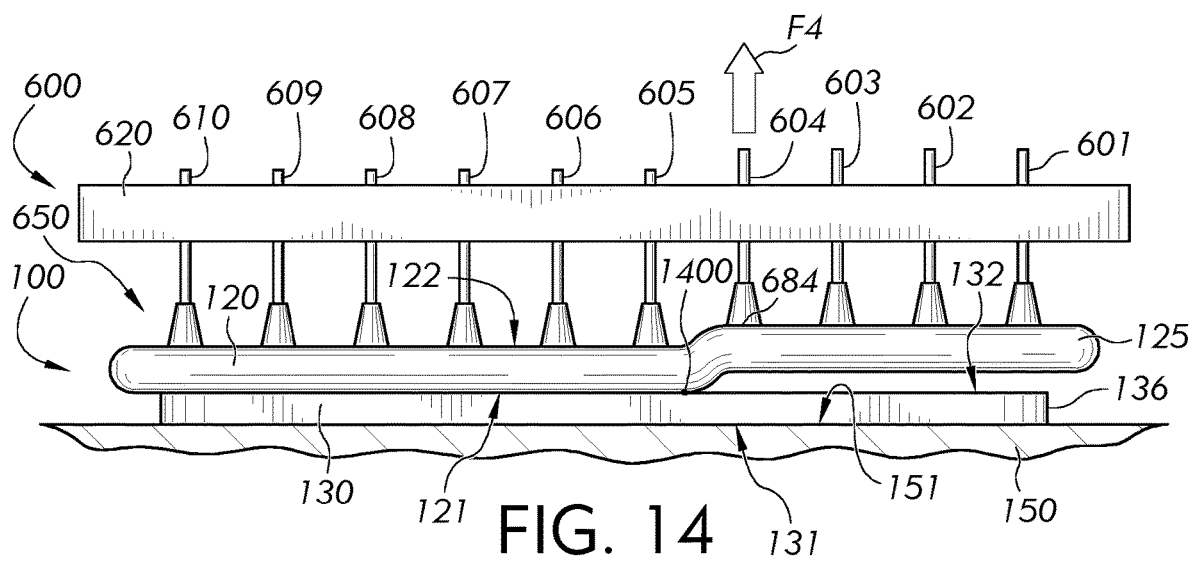
Figure 15:
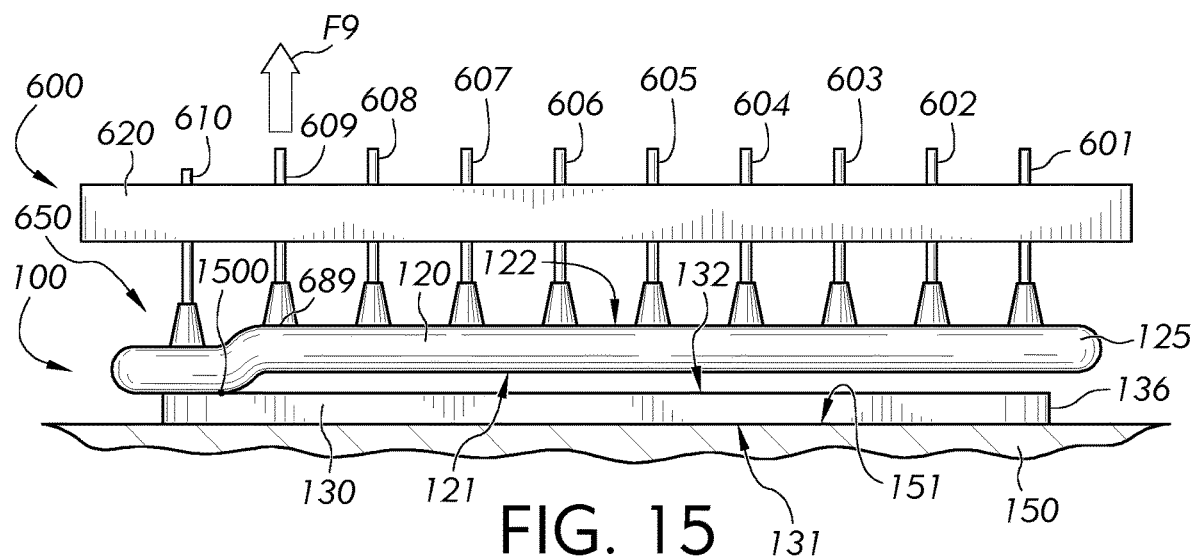
Figure 16:
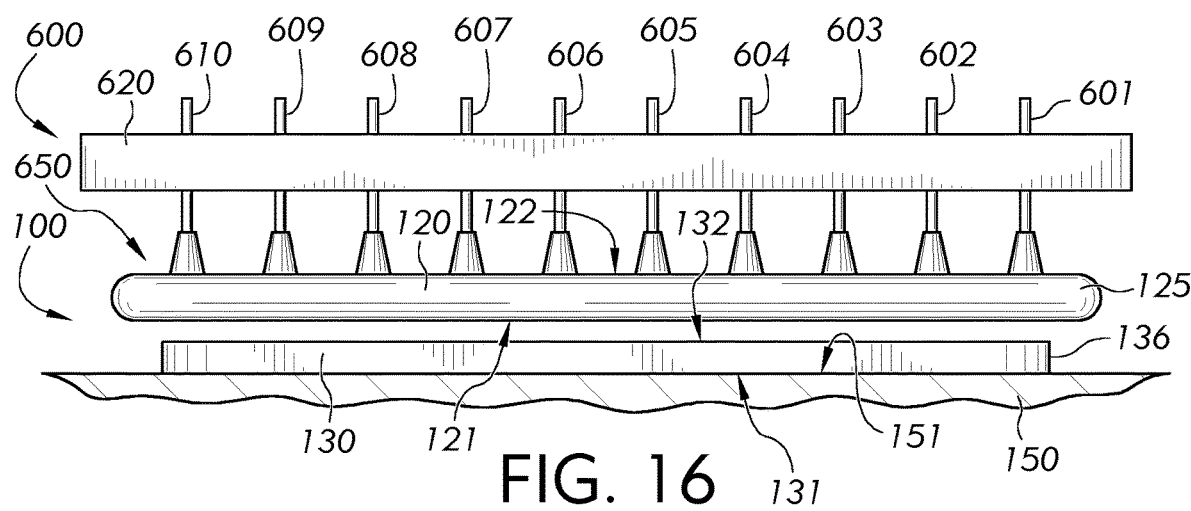
FIG. 16 illustrates exemplary methods of propagating the second debond front of FIGS. 13-15 until the second carrier is completely separated from the substrate in accordance with embodiments of the disclosure.

For example, FIGS. 13-15 illustrate exemplary methods of propagating the second debond front 1300, 1400, 1500 by sequentially applying a plurality of lifting forces to the second carrier 120 at the corresponding plurality of second sequential lifting locations 681, 682, 683, 684, 685, 686, 687, 688, 689, 690 of the second carrier 120. To schematically illustrate a dynamic propagation of the second debond front, three representative moments in time of the continuous propagation of the second debond front are illustrated simultaneously in FIG. 7 and FIG. 8 with the understanding that each representative moment in time occurs at a discrete moment in time during the continuous propagation of the second debond front as illustrated individually in FIGS. 13-15. For example, FIG. 13 illustrates the second debond front 1300 at a first discrete moment in time; FIG. 14 illustrates the second debond front 1400 at a second discrete moment in time occurring after the first discrete moment in time of FIG. 13; and FIG. 15 illustrates the second debond front 1500 at a third discrete moment in time occurring after the second discrete moment in time of FIG. 14. Additionally, FIG. 16 illustrates exemplary methods of propagating the second debond front 1300, 1400, 1500 of FIGS. 13-15 until the second carrier 120 is completely separated from the substrate 130. For example, FIG. 16 illustrates the method of processing the substrate 130 at a fourth discrete moment in time occurring after the third discrete moment in time of FIG. 15.

Turning back to FIGS. 7 and 8, as shown, the second location 500 of the outer peripheral bonded interface between the substrate 130 and the second carrier 120 may include a corner portion of the substrate 130 where debonding between the substrate 130 and the second carrier 120 has been initiated (e.g., as shown in FIG. 5). In some embodiments, the corner portion of the substrate 130 may be defined between an intersection of the first edge 401 and the second edge 402 of the substrate 130. As shown in FIG. 7, in some embodiments, the second location 500 of the outer peripheral bonded interface between the substrate 130 and the second carrier 120 may be extended (e.g., widened) to include an outer peripheral edge (e.g., the entire first edge 401) of the substrate 130. Accordingly, as shown, in some embodiments, the second direction 800 may extend perpendicular to the outer peripheral edge 401 of the substrate 130 and across the substrate 130. Alternatively, as shown in FIG. 8, the second direction 800 may extend from the corner portion (e.g., from the intersection of the first edge 401 and the second edge 402) of the substrate 130 diagonally across the substrate 130.

In some embodiments, propagating at least one of the first debond front 900, 1000, 1100 and the second debond front 1300, 1400, 1500 diagonally across the substrate 130 may provide a smoother (e.g., more fluid) propagation of the respective debond front than, for example, propagating at least one of the first debond front 900, 1000, 1100 and the second debond front 1300, 1400, 1500 perpendicular to the outer peripheral edge 401 across the substrate 130. Additionally, in some embodiments, propagating at least one of the first debond front 900, 1000, 1100 and the second debond front 1300, 1400, 1500 diagonally across the substrate 130 may require less force to peel at least one of the first carrier 110 and the second carrier 120 from the substrate 130 than, for example, a comparable force to peel at least one of the first carrier 110 and the second carrier 120 from the substrate 130 when propagating at least one of the first debond front 900, 1000, 1100 and the second debond front 1300, 1400, 1500 perpendicular to the outer peripheral edge 401 across the substrate 130.

For example, in some embodiments, a bending stiffness of the substrate 130 may be nonuniform and may vary depending on a localized stiffness of the substrate 130 at one or more localized locations of the substrate 130. For example, in some embodiments, the interface wall 145 may alter or control a localized stiffness of the substrate 130, such that, depending on an orientation of the substrate 130 relative to an applied bending moment, the bending stiffness of the substrate 130 may be nonuniform. Propagating at least one of the first debond front 900, 1000, 1100 and the second debond front 1300, 1400, 1500 diagonally across the substrate 130 may accommodate (e.g., compensate) for the nonuniform bending stiffness of the substrate 130. For example, in some embodiments, the interface wall 145 may extend along a peripheral boundary of the substrate 130; and, in some embodiments, at least a portion of the peripheral boundary may extend substantially parallel to the direction of propagation of the debond front when the debond front is propagated perpendicular to the outer peripheral edge 401 across the substrate 130. The substantially parallel alignment of the at least a portion of the peripheral boundary of the interface wall 145 and the direction of propagation perpendicular to the outer peripheral edge 401 across the substrate 130 may, in some embodiments, stall or interrupt propagation of the debond front. To overcome the interruption of the propagation, in some embodiments, a peeling force to debond at least one of the first carrier 110 and the second carrier 120 from the substrate 130 may be increased. However, as the applied force increases, the likelihood of damaging one or more of the first carrier 110, the second carrier 120, and the substrate 130 may also increase. For example, applying a force to debond at least one of the first carrier 110 and the second carrier 120 from the substrate 130 to propagate the debond front may stress one or more of the first carrier 110, the second carrier 120, and the substrate 130. Therefore, increased applied forces may result in increased stresses in one or more of the first carrier 110, the second carrier 120, and the substrate 130.

Alternatively, by propagating at least one of the first debond front 900, 1000, 1100 and the second debond front 1300, 1400, 1500 diagonally across the substrate 130, stalling or interruption of propagation of the debond front may be reduced or eliminated. That is, propagating the debond front diagonally across the substrate 130 may alter the otherwise substantially parallel alignment of the at least a portion of the peripheral boundary of the interface wall 145 and the direction of propagation perpendicular to the outer peripheral edge 401 across the substrate 130. Thus, a substantially non-parallel alignment (e.g., diagonal alignment) of the at least a portion of the peripheral boundary of the interface wall 145 and the direction of propagation may provide a continuous propagation of the debond with comparably less applied force to debond at least one of the first carrier 110 and the second carrier 120 from the substrate 130 than a substantially parallel alignment of the at least a portion of the peripheral boundary of the interface wall 145 and the direction of propagation. Accordingly, in some embodiments, propagating at least one of the first debond front 900, 1000, 1100 and the second debond front 1300, 1400, 1500 diagonally across the substrate 130 may reduce and minimize stress of one or more of the first carrier 110, the second carrier 120, and the substrate 130. Therefore, the likelihood of damaging one or more of the first carrier 110, the second carrier 120, and the substrate 130 based on applying forces to propagate the debond front may, likewise, also be reduced and minimized.

Moreover, in some embodiments, with respect to completely separating at least one of the first carrier 110 and the second carrier 120 from the substrate 130, propagating at least one of the first debond front 900, 1000, 1100 and the second debond front 1300, 1400, 1500 diagonally across the substrate 130 may control the debond front to reach a portion of the substrate 130 opposite at least one of the first location 400 and the second location 500 relative to a respective first direction 700 and second direction 800 in a manner that provides a gentler, more controllable complete separation of at least one of the first carrier 110 and the second carrier 120 from the substrate 130. For example, as shown in FIG. 8, propagating at least one of the first debond front 900, 1000, 1100 and the second debond front 1300, 1400, 1500 diagonally across the substrate 130 controls the debond front to reach (and propagate along) opposing edges 403, 404 of the substrate 130 at different times such that peeling and complete separation of at least one of the first carrier 110 and the second carrier 120 from the substrate 130 may be performed in a more controllable, gentler manner, thus reducing the likelihood of stressing and damaging one or more of the first carrier 110, the second carrier 120, and the substrate 130.

Conversely, as shown in FIG. 7, propagating at least one of the first debond front 900, 1000, 1100 and the second debond front 1300, 1400, 1500 perpendicular to the outer peripheral edge 401 of the substrate 130 across the substrate 130 controls the debond front to reach (and propagate along) opposing edge 403 of the substrate 130 at a substantially instantaneous moment in time. In some embodiments, attempting to completely separate at least one of the first carrier 110 and the second carrier 120 from the substrate 130 with a final debonding of the entire opposing edge 403 of the substrate 130 occurring substantially instantaneously at a moment in time may result in a sudden and less controllable peeling and complete separation of at least one of the first carrier 110 and the second carrier 120 from the substrate 130. Thus, in some embodiments, attempting to completely separate at least one of the first carrier 110 and the second carrier 120 from the substrate 130 with a final debonding of the entire opposing edge 403 of the substrate 130 occurring substantially instantaneously at a moment in time may increase the likelihood of stressing and damaging one or more of the first carrier 110, the second carrier 120, and the substrate 130. Accordingly, propagating at least one of the first debond front 900, 1000, 1100 and the second debond front 1300, 1400, 1500 diagonally across the substrate 130 (e.g., as shown in FIG. 8) may therefore, in some embodiments, provide a more efficient and more reliable method of processing the substrate 130 than, for example, propagating at least one of the first debond front 900, 1000, 1100 and the second debond front 1300, 1400, 1500 perpendicular to the outer peripheral edge 401 of the substrate 130 across the substrate 130 (e.g., as shown in FIG. 7).

As shown in FIGS. 7 and 8, the rows 601, 602, 603, 604, 605, 606, 607, 608, 609, 610 of suction cups of the plurality of suction cups 650 may be arranged along at least one of the first direction 700 and the second direction 800. In some embodiments, the plurality of lifting forces (e.g., a lifting force from a respective row of suction cups) may be sequentially applied at a corresponding lifting location of the respective first plurality of sequential lifting locations 671, 672, 673, 674, 675, 676, 677, 678, 679, 680 of the first carrier 110 (shown in FIG. 6) and the second plurality of sequential lifting locations 681, 682, 683, 684, 685, 686, 687, 688, 689, 690 of the second carrier 120 (shown in FIG. 13). In some embodiments, the plurality of lifting forces (e.g., a lifting force from a respective row of suction cups) may be sequentially applied after the first debond front 900, 1000, 1100 has propagated past the corresponding lifting location of the first carrier 110 (e.g., when debonding the first carrier 110 from the substrate 130) and after the second debond front 1300, 1400, 1500 has propagated past the corresponding lifting location of the second carrier 120 (e.g., when debonding the second carrier 120 from the substrate 130). For example, in some embodiments, after initiating debonding of at least one of the first carrier 110 and the second carrier 120 from the substrate 130 (e.g., with tool 170, shown in FIG. 1), the plurality of lifting forces (e.g., a lifting force from a respective row of suction cups) may be sequentially applied at a corresponding lifting location of the first carrier 110 and the second carrier 120.

Sequentially applying a respective sequential lifting force at a corresponding lifting location of the first carrier 110 and the second carrier 120 may facilitate debonding between the first carrier 110 and the substrate 130 and the second carrier 120 and the substrate 130 based on peeling of the first carrier 110 relative to the substrate 130 and peeling of the second carrier 120 relative to the substrate 130. In some embodiments, peeling as compared to translation (e.g., lifting) of the first carrier 110 away from the substrate 130 and lifting of the second carrier 120 away from the substrate 130 may provide a more controllable propagation of the respective debond front. Moreover, in some embodiments, propagating the debond front by peeling may be accomplished with application of relatively smaller forces compared to forces require to propagate the debond front by translation (e.g., lifting). Accordingly, when debonding the first carrier 110 from the substrate 130, sequentially applying a lifting force from a respective row of suction cups after the first debond front 900, 1000, 1100 has propagated past the corresponding lifting location of the first carrier 110, applies a peeling force (and not a lifting force) to the first carrier 110 to propagate the first debond front 900, 1000, 1100 and debond the first carrier 110 from the substrate 130. Likewise, when debonding the second carrier 120 from the substrate 130, sequentially applying a lifting force from a respective row of suction cups after the second debond front 1300, 1400, 1500 has propagated past the corresponding lifting location of the second carrier 120 applies a peeling force (and not a lifting force) to the second carrier 120 to propagate the second debond front 1300, 1400, 1500 and debond the second carrier 120 from the substrate 130.

Accordingly, as the first carrier 110 is peeled away from the substrate 130, the first debond front 900, 1000, 1100 may sequentially propagate along the first direction 700. Similarly, as the second carrier 120 is peeled away from the substrate 130, the second debond front 1300, 1400, 1500 may sequentially propagate along the second direction 800. In some embodiments, the method of processing the substrate 130 may include continuously propagating the first debond front 900, 1000, 1100 without ceasing propagation of the first debond front 900, 1000, 1100 until the first carrier 110 is completely separated from the substrate 130. Similarly, in some embodiments, the method of processing the substrate 130 may include continuously propagating the second debond front 1300, 1400, 1500 without ceasing propagation of the second debond front 1300, 1400, 1500 until the second carrier 120 is completely separated from the substrate 130. In some embodiments, continuously propagating the debond front without ceasing propagation may reduce the applied force to debond at least one of the first carrier 110 and the second carrier 120 from the substrate 130. For example, once the propagation of the debond front begins, the potential (e.g., static) energy bonding the at least one of the first carrier 110 and the second carrier 120 to the substrate 130 is released, and to advance the debond front, propagation may continue by overcoming, for example, dynamic bond energy. Thus, once the propagation of the debond front beings, it may be advantageous to continuously propagate the debond front without ceasing propagation of the debond front to avoid having to overcome the potential (e.g., static) energy bonding the at least one of the first carrier 110 and the second carrier 120 to the substrate 130 that is present when the debond front is stationary.

Accordingly, by sequentially applying a lifting force from a respective row of suction cups after the debond front has propagated past the corresponding lifting location and thereby peeling (e.g., continuously peeling without ceasing peeling) at least one of the first carrier 110 and the second carrier 120 from the substrate 130, features of the disclosure may reduce the applied force to debond at least one of the first carrier 110 and the second carrier 120 from the substrate 130. Additionally, by sequentially applying a lifting force from a respective row of suction cups after the debond front has propagated past the corresponding lifting location and thereby peeling (e.g., continuously peeling without ceasing peeling) at least one of the first carrier 110 and the second carrier 120 from the substrate 130, in some embodiments, the likelihood of stressing and damaging one or more of the first carrier 110, the second carrier 120, and the substrate 130 may likewise be reduced. Accordingly, propagating at least one of the first debond front 900, 1000, 1100 and the second debond front 1300, 1400, 1500 by sequentially applying a lifting force from a respective row of suction cups after the debond front has propagated past the corresponding lifting location and thereby peeling (e.g., continuously peeling without ceasing peeling) at least one of the first carrier 110 and the second carrier 120 from the substrate 130 may, in some embodiments, provide a more efficient and more reliable method of processing the substrate 130.

For example, as shown in FIG. 6, in some embodiments, the plurality of suction cups 650 may engage the first carrier 110 (e.g., contact, and provide a suction force) prior to propagating the first debond front 900, 1000, 1100. For example, in some embodiments, the plurality of suction cups 650 may engage the first carrier 110, and then the plurality of lifting forces may be sequentially applied by a respective suction cup (e.g., row of suction cups) of the plurality of suction cups 650 after the first debond front 900, 1000, 1100 propagates past the respective suction cup and before the first debond front 900, 1000, 1100 propagates past an immediately adjacent suction cup (e.g., row of suction cups) of the plurality of suction cups 650 arranged downstream from the respective suction cup along the first direction 700. Likewise, although not illustrated, in some embodiments, the plurality of suction cups 650 may engage the second carrier 120 (e.g., contact, and provide a suction force) prior to propagating the second debond front 1300, 1400, 1500. For example, in some embodiments, the plurality of suction cups 650 may engage the second carrier 120, and then the plurality of lifting forces may be sequentially applied by a respective suction cup (e.g., row of suction cups) of the plurality of suction cups 650 after the second debond front 1300, 1400, 1500 propagates past the respective suction cup and before the second debond front 1300, 1400, 1500 propagates past an immediately adjacent suction cup (e.g., row of suction cups) of the plurality of suction cups 650 arranged downstream from the respective suction cup along the second direction 800.

For example, as shown in FIG. 9, the method of processing the substrate 130 may include applying a sequential lifting force "F1" to a corresponding sequential lifting location 671 of the first carrier 110 (e.g., by lifting row 601 of the plurality of suction cups 650) after the first debond front 900 has propagated past the corresponding sequential lifting location 671 of the first carrier 110. Additionally, in some embodiments, the sequential lifting force "F1" may be applied to the corresponding sequential lifting location 671 of the first carrier 110 after the first debond front 900 has propagated past the corresponding sequential lifting location 671 of the first carrier 110 and before the first debond front 900 propagates past an immediately adjacent suction cup (e.g., row 602) of the plurality of suction cups 650 arranged downstream from the respective suction cup row 601 along the propagation direction. As shown in FIG. 10, as the first debond front 900 of FIG. 9 propagates as illustrated by first debond front 1000, the method of processing the substrate 130 may further include applying a sequential lifting force "F4" to a corresponding sequential lifting location 674 of the first carrier 110 (e.g., by lifting row 604 of the plurality of suction cups 650) after the first debond front 1000 has propagated past the corresponding sequential lifting location 674 of the first carrier 110. Additionally, in some embodiments, the sequential lifting force "F4" may be applied to the corresponding sequential lifting location 674 of the first carrier 110 after the first debond front 1000 has propagated past the corresponding sequential lifting location 674 of the first carrier 110 and before the first debond front 1000 propagates past an immediately adjacent suction cup (e.g., row 605) of the plurality of suction cups 650 arranged downstream from the respective suction cup row 604 along the propagation direction. As shown in FIG. 11, as the first debond front 1000 of FIG. 10 propagates as illustrated by first debond front 1100, the method of processing the substrate 130 may further include applying a sequential lifting force "F9" to a corresponding sequential lifting location 679 of the first carrier 110 (e.g., by lifting row 609 of the plurality of suction cups 650) after the first debond front 1100 has propagated past the corresponding sequential lifting location 679 of the first carrier 110. Additionally, in some embodiments, the sequential lifting force "F9" may be applied to the corresponding sequential lifting location 679 of the first carrier 110 after the first debond front 1100 has propagated past the corresponding sequential lifting location 679 of the first carrier 110 and before the first debond front 1100 propagates past an immediately adjacent suction cup (e.g., row 610) of the plurality of suction cups 650 arranged downstream from the respective suction cup row 609 along the propagation direction.

As shown in FIG. 12, the plurality of suction cups 650 may releasably hold the first carrier 110 once the first debond front 900, 1000, 1100 has propagated and the first carrier 110 has completely separated from the substrate 130. Additionally, in some embodiments, the method of processing the substrate 130 may include inhibiting bending of the second carrier 120 while sequentially applying the plurality of lifting forces (e.g., "F1", "F4", "F9") to the first carrier 110. In some embodiments, inhibiting bending of the second carrier 120 may include removably attaching the second major surface 122 of the second carrier 120 to the plate 151 to inhibit bending of the second carrier 120 while sequentially applying the plurality of lifting forces (e.g., "F1", "F4", "F9") to the first carrier 110.

As shown in FIG. 13, after completely separating the first carrier 110 from the substrate 130, the method of processing the substrate 130 may then include applying a sequential lifting force "F1" to a corresponding sequential lifting location 681 of the second carrier 120 (e.g., by lifting row 601 of the plurality of suction cups 650) after the second debond front 1300 has propagated past the corresponding sequential lifting location 681 of the second carrier 120. Additionally, in some embodiments, the sequential lifting force "F1" may be applied to the corresponding sequential lifting location 681 of the second carrier 120 after the second debond front 1300 has propagated past the corresponding sequential lifting location 681 of the second carrier 120 and before the second debond front 1300 propagates past an immediately adjacent suction cup (e.g., row 602) of the plurality of suction cups 650 arranged downstream from the respective suction cup row 601 along the propagation direction. As shown in FIG. 14, as the second debond front 1300 of FIG. 13 propagates as illustrated by second debond front 1400, the method of processing the substrate 130 may further include applying a sequential lifting force "F4" to a corresponding sequential lifting location 684 of the second carrier 120 (e.g., by lifting row 604 of the plurality of suction cups 650) after the second debond front 1400 has propagated past the corresponding sequential lifting location 684 of the second carrier 120. Additionally, in some embodiments, the sequential lifting force "F4" may be applied to the corresponding sequential lifting location 684 of the second carrier 120 after the second debond front 1400 has propagated past the corresponding sequential lifting location 684 of the second carrier 120 and before the second debond front 1400 propagates past an immediately adjacent suction cup (e.g., row 605) of the plurality of suction cups 650 arranged downstream from the respective suction cup row 604 along the propagation direction. As shown in FIG. 15, as the second debond front 1400 of FIG. 14 propagates as illustrated by second debond front 1500, the method of processing the substrate 130 may further include applying a sequential lifting force "F9" to a corresponding sequential lifting location 689 of the second carrier 120 (e.g., by lifting row 609 of the plurality of suction cups 650) after the second debond front 1500 has propagated past the corresponding sequential lifting location 689 of the second carrier 120. Additionally, in some embodiments, the sequential lifting force "F9" may be applied to the corresponding sequential lifting location 689 of the second carrier 120 after the second debond front 1500 has propagated past the corresponding sequential lifting location 689 of the second carrier 120 and before the second debond front 1500 propagates past an immediately adjacent suction cup (e.g., row 610) of the plurality of suction cups 650 arranged downstream from the respective suction cup row 609 along the propagation direction.

As shown in FIG. 16, the plurality of suction cups 650 may releasably hold the second carrier 120 once the second debond front 1300, 1400, 1500 has propagated and the second carrier 120 has completely separated from the substrate 130. Additionally, in some embodiments, the method of processing the substrate 130 may include inhibiting bending of the substrate 130 while sequentially applying the plurality of lifting forces (e.g., "F1", "F4", "F9") to the second carrier 120. In some embodiments, inhibiting bending of the substrate 130 may include removably attaching the first major surface 131 of the substrate 130 to the plate 151 to inhibit bending of the substrate 130 while applying the plurality of lifting forces (e.g., "F1", "F4", "F9") to the second carrier 120.

Additionally, in some embodiments, the ability of the plate 151 to releasably secure the apparatus 100 may also limit the amount of force that may be applied to at least one of the first carrier 110 and the second carrier 120. For example, an applied force (e.g., by the debonding device 600) greater than a counteracting force that releasably secures the apparatus 100 to the plate 151 may separate the apparatus 100 from the plate 151 prior to propagation (e.g., complete propagation) of the debond front. Therefore, in some embodiments, the counteracting force that releasably secures the apparatus 100 to the plate 151 may be selected to provide a threshold relative to the applied force (e.g., by the debonding device 600) above which the apparatus 100 will intentionally separate from the plate 151, for example, prior to one or more of the first carrier 110, the second carrier 120, and the substrate 130 breaking.

In some embodiments, the method of processing the substrate 130 may optionally include decreasing bond energy between the substrate 130 and at least one of first carrier 110 and the second carrier 120 based on a thermoelectric effect. For example, in some embodiments, decreasing bond energy between the substrate 130 and at least one of first carrier 110 and the second carrier 120 may include decreasing a temperature of at least one of first carrier 110 and the second carrier 120. Without being bound by theory, it is believed that decreasing the temperature of at least one of first carrier 110 and the second carrier 120 reduces the bond energy and, therefore, reduces the strength of the bond such that comparatively smaller forces may be applied (e.g., by the debonding device 600) to propagate the debond front than, for example, forces to propagate the debond front without decreasing bond energy between the substrate 130 and at least one of first carrier 110 and the second carrier 120 based on a thermoelectric effect.

Additionally, in some embodiments, the method of processing the substrate 130 may optionally include decreasing bond energy between the substrate 130 and at least one of first carrier 110 and the second carrier 120 based on a de-ionizing effect. For example, in some embodiments, decreasing bond energy between the substrate 130 and at least one of first carrier 110 and the second carrier 120 may include neutralizing static generated during debonding of at least one of first carrier 110 and the second carrier 120 from the substrate 130. Without being bound by theory, it is believed that neutralizing the static generated during debonding reduces the bond energy and, therefore, reduces the strength of the bond such that comparatively smaller forces may be applied (e.g., by the debonding device 600) to propagate the debond front than, for example, forces to propagate the debond front without neutralizing the static generated during debonding between the substrate 130 and at least one of first carrier 110 and the second carrier 120 based on a de-ionizing effect.

As used herein, "bond," "bond energy," and "bond strength" may refer to any one or more of dynamic shear strength, dynamic peel strength, static shear strength, static peel strength and combinations thereof. Peel strength, for example, is the force per unit width to initiate failure (e.g. static) and/or to maintain a specified rate of failure (e.g. dynamic) by means of a stress applied to a bonded interface between at least one of the first carrier 110 and the second carrier 120 and the substrate 130 in a peeling mode. Shear strength is the force per unit width to initiate failure (e.g. static) and/or maintain a specified rate of failure (e.g. dynamic) by means of a stress applied to a bonded interface between at least one of the first carrier 110 and the second carrier 120 and the substrate 130 in a shear mode. Any suitable methods may be used to determine bond strength including any suitable peel and/or shear strength tests.

Directional terms as used herein—for example up, down, right, left, front, back, top, bottom—are made only with reference to the figures as drawn and are not intended to imply absolute orientation.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially" is intended to denote that two values are equal or approximately equal. In some embodiments, "substantially" may denote values within about 10% of each other, such as within about 5% of each other, or within about 2% of each other.

The above embodiments, and the features of those embodiments, are exemplary and may be provided alone or in any combination with any one or more features of other embodiments provided herein without departing from the scope of the disclosure.

It will be apparent to those skilled in the art that various modifications and variations may be made to the present disclosure without departing from the spirit and scope of the disclosure. Thus, it is intended that the present disclosure cover the modifications and variations of this disclosure provided they come within the scope of the appended claims and their equivalents.

What is claimed is:

1. A method of processing a substrate, the method comprising:
    initiating debonding via a tool at a first location of an outer peripheral bonded interface between the substrate and a first carrier to separate a portion of the first carrier from the substrate, thereby creating a first debond front having a first debond location; and
    engaging a plurality of suction cups to the first carrier prior to propagating the first debond front, wherein the plurality of suction cups are configured to provide a plurality of lifting forces are sequentially applied by a respective suction cup of the plurality of suction cups after the first debond front propagates past the respective suction cup and before the first debond front propagates past an immediately adjacent suction cup of the plurality of suction cups arranged downstream from the respective suction cup along the first direction; and
    propagating the first debond front from the first debonded location along a first direction extending away from the first debonded location by sequentially applying a plurality of lifting forces by a corresponding plurality of suction cups arranged along the first direction to the first carrier at a corresponding plurality of sequential lifting locations of the first carrier, wherein each lifting force of the plurality of lifting forces being applied at a corresponding lifting location of the plurality of sequential lifting locations after the first debond front has propagated past the corresponding lifting location of the first carrier, to thereby continuously peel without ceasing to peel the first carrier from the substrate, until the first carrier is completely separated from the substrate.

2. The method of claim 1, comprising decreasing bond energy between the substrate and the first carrier based on thermoelectric effect.

3. The method of claim 2, decreasing bond energy between the substrate and the first carrier comprises decreasing a temperature of the first carrier.

4. The method of claim 1, comprising inhibiting bending of a second carrier bonded to said substrate, while applying the plurality of lifting forces to the first carrier.

5. The method of claim 4, inhibiting bending of the second carrier comprises removably attaching a second major surface of the second carrier to a plate to inhibit bending of the second carrier while applying the plurality of lifting forces to the first carrier.

6. The method of claim 1, wherein the substrate is configured with a corner portion, wherein the first location of the outer peripheral bonded interface between the substrate and the first carrier comprising the corner portion of the substrate.

7. The method of claim 6, the first direction extending from the corner portion of the substrate diagonally across the substrate.

8. The method of claim 1, the first location of the outer peripheral bonded interface between the substrate and the first carrier comprising a linear outer peripheral edge of the substrate, the first direction extending perpendicular to the linear outer peripheral edge of the substrate and across the substrate.

9. The method of claim 1, comprising, after completely separating the first carrier from the substrate, then initiating debonding at a second location, the second location being an outer peripheral bonded interface between the substrate and a second carrier, to separate a portion of the second carrier from the substrate, and propagating a second debond front from the debonded second location along a second direction extending away from the debonded second location by sequentially applying a plurality of lifting forces to the second carrier at a corresponding plurality of sequential lifting locations of the second carrier, each lifting force of the plurality of lifting forces being sequentially applied to a corresponding lifting location of the plurality of sequential lifting locations after the second debond front has propagated past the corresponding lifting location of the second carrier.

10. The method of claim 9, comprising sequentially applying the plurality of lifting forces to the second carrier at the corresponding plurality of sequential lifting locations of the second carrier to propagate the second debond front until the second carrier is completely separated from the substrate.

11. The method of claim 9, comprising continuously propagating the second debond front without ceasing propagation of the second debond front until the second carrier is completely separated from the substrate.

12. The method of claim 9, comprising decreasing bond energy between the substrate and the second carrier based on thermoelectric effect.

13. The method of claim 9, comprising inhibiting bending of the substrate while applying the plurality of lifting forces to the second carrier.

14. The method of claim 9, wherein the substrate is configured with a corner portion, wherein the second location of the outer peripheral bonded interface between the substrate and the second carrier comprising the corner portion of the substrate.

15. The method of claim 9, the second location of the outer peripheral bonded interface between the substrate, wherein the substrate is configured with at least one corner portion, and the second carrier comprising a linear outer peripheral edge of the substrate, the second direction extending perpendicular to the linear outer peripheral edge of the substrate and across the substrate.

16. The method of claim 1, the substrate comprises at least one of glass and silicon.

17. The method of claim 1, wherein one or more corners of the substrate include a rounded corner, a chamfered corner or other shape corner.

* * * * *

UNITED STATES PATENT AND TRADEMARK OFFICE
CERTIFICATE OF CORRECTION

| | |
|---|---|
| PATENT NO. | : 11,260,646 B2 |
| APPLICATION NO. | : 16/349845 |
| DATED | : March 1, 2022 |
| INVENTOR(S) | : Christina Sue Bennett et al. |

It is certified that error appears in the above-identified patent and that said Letters Patent is hereby corrected as shown below:

In the Specification

In Column 1, Line 11, delete "filed" and insert -- , filed --.

In the Claims

In Column 29, Line 15, in Claim 17, delete "corner" and insert -- corner, --.

Signed and Sealed this
Twelfth Day of July, 2022

Katherine Kelly Vidal
*Director of the United States Patent and Trademark Office*